US006583461B2

(12) United States Patent
Yokoyama et al.

(10) Patent No.: US 6,583,461 B2
(45) Date of Patent: Jun. 24, 2003

(54) SEMICONDUCTOR DEVICE AND METHOD OF MANUFACTURING THE SAME

(75) Inventors: Yuichi Yokoyama, Tokyo (JP); Shunji Yasumura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/938,833

(22) Filed: Aug. 27, 2001

(65) Prior Publication Data
US 2002/0028553 A1 Mar. 7, 2002

(30) Foreign Application Priority Data

Aug. 28, 2000 (JP) ........................................ 2000-256964

(51) Int. Cl.⁷ ........................ H01L 27/108; H01L 29/76; H01L 29/94
(52) U.S. Cl. ........................ 257/301; 257/303; 257/306; 438/244; 438/243; 438/253; 438/387
(58) Field of Search ................................. 438/253, 244, 438/243, 387, 396; 257/301–303, 306

(56) References Cited

U.S. PATENT DOCUMENTS 5,981,334 A * 11/1999 Chien et al. ................. 438/253
6,187,624 B1 * 2/2001 Huang ......................... 438/253

FOREIGN PATENT DOCUMENTS

| JP | 63-278363 | 11/1988 |
| JP | 10-256504 | 9/1998 |

* cited by examiner

Primary Examiner—Olik Chaudhuri
Assistant Examiner—Hsien Ming Lee
(74) Attorney, Agent, or Firm—McDermott, Will & Emery

(57) ABSTRACT

The semiconductor device comprises a capacitor electrode defining openings which are made in each insulating layer, are communicated with one another and have different diameters at least at their coupling portions, the capacitor electrode is formed to extend along the surfaces of the openings.

13 Claims, 27 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing it, and more particularly to a semiconductor device provided with a capacitor having a large capacitance in a form that the surface area of an opening where a capacitor electrode is formed is increased, and a method of manufacturing such a semiconductor device.

2. Description of the Related Art

The semiconductor device having a capacitor such as DRAM has a problem that a capacity of the capacitor decreases with development of downsizing of an element. In recent years, in order to solve this problem, various capacitors have been proposed. One of them is a cylindrical capacitor. FIGS. 29A and 29B are a sectional view and a plan view each showing a part of a conventional semiconductor device having the cylindrical capacitor.

Referring to FIG. 29, a gate wiring(s) 103 is formed on a semiconductor substrate 101 through a gate insulating film not shown. On the upper surface and side surface of the gate wiring 103, a silicon oxide film 105 and a nitride film side wall 107 are formed, respectively. Further, on the oxide film 105, a nitride film 109 is formed as an etching stopper film. On the gate wiring 103, an insulating film 111 having an opening(s) 113 which reaches the semiconductor substrate 101 is formed through these insulating film. The openings 113 are filled with conductive layers 115 and 116 which are electrically connected to the semiconductor substrate 101.

On the insulating film 111, an interlayer insulating film 121 including a bit wiring 125 is formed. In the interlayer insulating film 121, an opening(s) 123 communicating with the openings 113 is formed. The opening 123 is filled with a bit wiring 125 which is connected to the semiconductor substrate 101 through the conductive layer 115. An opening 135 is formed to pass through between the bit wirings 125 and to communicate with the opening 113. The opening 135 is filled with a conductive layer 137 which is connected with the semiconductor substrate 101 through the conductive layer 116.

On the interlayer insulating film 121, an interlayer insulating film 139 having a cylindrical opening 143 communicating with the opening 135 is formed. Within the opening 143, a cylindrical capacitor 159 is formed along inner wall of the cylindrical opening 143. The cylindrical capacitor 159 includes a capacitor lower electrode 152, a capacitor dielectric film 154 and a capacitor upper electrode 156. The capacitor 159 is electrically connected to the semiconductor substrate 101 through the conductive layer 137 and the conductive layer 116.

Referring to sectional views showing a manufacturing process in FIGS. 30 to 38, an explanation will be given of a method of manufacturing the semiconductor device described above.

First, referring to FIG. 30, on a semiconductor substrate 101, gate wirings 103 each covered with an oxide film 105 as a hard mask is formed. A side wall film 107 made of a nitride film is formed on a side surfaces of the gate wirings 103. On the gate wirings 103, an etching stopper 109 made of a nitride film and an insulating film 111 made of an oxide film are formed successively.

Referring to FIG. 31, using a resist film 113 as a mask, the insulating film 111 and etching stopper 109 are etched to expose the semiconductor substrate 101 so that openings 113 are formed.

In this case, owing to this etching, a modified layer is formed on the surface of the semiconductor substrate 101. This modified layer is removed by dry etching.

Referring to FIG. 32, a conductive layer 115 is formed within each of the openings 113 by etch-back technique or CMP (Chemical Mechanical Polishing) technique.

Referring to FIG. 33, an insulating film 118 made of an oxide film is formed on the insulating film 111. On the insulating film 118, a resist film 173 having a desired pattern is formed. Thereafter, using the resist film 173 as a mask, the insulating film 118 is etched to make an opening 123 which reaches the conductive layer 115.

In this case, since a modified layer due to the dry etching is formed on a surface of the conductive layer 115 within the opening 123, this modified layer is removed by dry etching.

Referring to FIG. 34, a bit wiring 125 is formed on the insulating film 118 so as to be embedded in the opening 123.

Referring to FIG. 35, an insulating film 120 made of an oxide film is formed on the bit wiring 125. A resist film 183 having a desired pattern is formed on the insulating film 120. Thereafter, using the resist film 183 as a mask, an interlayer insulating film 121 including the insulating films 120 and 118 is etched to form an opening 135 which reaches the conductive layer 116. In this case, since the modified layer due to the etching is formed on a surface of the conductive layer 116, the modified layer is removed by the dry etching.

Referring to FIG. 36, a conductive layer 137 is formed within the opening 135 by the etch-back technique or CMP technique.

Referring to FIG. 37, an interlayer insulating film 139 is formed on the interlayer insulating film 121. Further, a resist film 177 having a desired pattern is formed on the interlayer insulating film 139. Thereafter, using the resist film 177 as a mask, the interlayer insulating film 139 is etched to form a cylindrical opening 143 which reaches the conductive layer 137. In this case, since the modified layer due to the etching is formed on a surface of the conductive layer 137, the modified layer is removed by the dry etching.

Referring to FIG. 38, a polysilicon film 151, oxide/nitride film 153 and polysilicon film 155 are formed on the interlayer insulating film 139 and along the inner wall of the cylindrical opening 143.

Finally, referring to FIG. 29 again, the polysilicon film 151, oxide/nitride film 153 and polysilicon film 155 which are located on the insulating film 139 are removed by the etch-back technique or CMP technique. Thus, a capacitor 159 which comprises the capacitor lower electrode 152, capacitor dielectric film 154 and a capacitor upper electrode 156 is formed to complete a semiconductor device.

However, in the above described conventional technique, when downsizing further proceeds, the cylindrical opening may be deepened in order to assure a necessary capacitance. This makes it very difficult to form the cylindrical opening. In addition, it is difficult to remove completely the modified layer produced due to etching to form the opening. The residue provides an increased contact resistance which leads to reduction of a response speed of the device.

SUMMARY OF THE INVENTION

The present invention has been accomplished to solve the problems described above.

A first object of the invention is to provide a semiconductor device which can increase the area of a capacitor electrode without greatly changing a conventional structure, thereby assuring sufficient capacitance of a capacitor.

A second object of the invention is to provide a semiconductor device which reduces the resistance between a capacitor electrode and a semiconductor substrate and have great reliability in electricity.

A third object of the invention is to provide a method of manufacturing the above described semiconductor device.

The semiconductor device having a capacitor, comprises:

a semiconductor substrate;

a plurality of insulating layers formed on the semiconductor substrate;

a plurality of openings formed in each of the insulating layer so as to communicate with one another, the openings having different diameters at least at each of coupling portions;

a conductive layer formed partially or substantially entirely in the opening in a lowermost layer of the multi-layer insulating layers in contact with the semiconductor substrate, and the conductive layer electrically connected to the semiconductor substrate;

a capacitor lower electrode formed to extend on the conductive layer and along the surfaces of the openings formed in each of the insulating layer; and a capacitor upper electrode formed on the capacitor lower electrode through a capacitor insulating film.

The semiconductor device having a capacitor, comprises:

a semiconductor substrate;

a first insulating layer formed on the semiconductor substrate, including a first wiring and having a first opening which reaches the semiconductor substrate;

a second insulating layer formed on the first insulating layer, including a second wiring and having a second opening which communicates with the first opening;

a third insulating layer formed on the second insulating layer, and having a third opening which communicates with the second opening;

a capacitor lower electrode formed on a surface of the first, second, and third openings; and a capacitor upper electrode formed on the capacitor lower electrode through a capacitor dielectric film, wherein the openings have different diameters from each other at least at each of their coupling portions, respectively.

The capacitor lower electrode is electrically connected to the semiconductor substrate through a conductive layer formed partially or substantially entirely in the first opening.

The first opening comprises the first insulating film and an etching stopper film formed on a surface of the first wiring.

The second opening comprises the second insulating film and an etching stopper film formed on a surface of the second wiring.

The method of manufacturing a semiconductor device having a capacitor, comprises the steps of:

forming, on a semiconductor substrate, a first insulating layer including a first wiring and having a first opening which reaches the semiconductor substrate;

forming, in the first opening, a first conductive layer electrically connected to the semiconductor substrate;

forming, on the first insulating layer, a second insulating layer including a second wiring;

forming, in the second insulating layer, a second opening communicating with the first opening and having a diameter different from that of the first opening at their coupling portion;

forming, in the second opening, a second conductive layer electrically connected to the first conductive layer;

forming a third insulating layer formed on the second insulating layer;

forming, in the third insulating layer, a third opening communicating with the second opening and having a diameter different from that of the second opening at their coupling portion;

removing at least the second conductive layer through the third opening;

forming, on a surface of the first, second, and third openings, a capacitor lower electrode electrically connected to the semiconductor substrate; and forming, on the capacitor lower electrode, a capacitor upper electrode through a capacitor dielectric film.

In the step of forming the second conductive layer, the second conductive layer is formed to extend onto the second insulating layer.

In the step of removing the second conductive layer, a part of the first conductive layer is removed, and the capacitor lower electrode is electrically connected to the semiconductor substrate through the first conductive layer.

The method of the manufacturing the semiconductor device having a capacitor, further comprises the steps of forming the first opening in a self-aligned manner using an etching stopper film formed on the first wiring.

The method of the manufacturing the semiconductor device having a capacitor, further comprises the steps of the second opening in a self-aligned manner using an etching stopper film formed on the second wiring.

DETAILED DESCRIPTION OF THE PREFERRED EMBODIMENTS

[Embodiment 1]

Figure 1A:
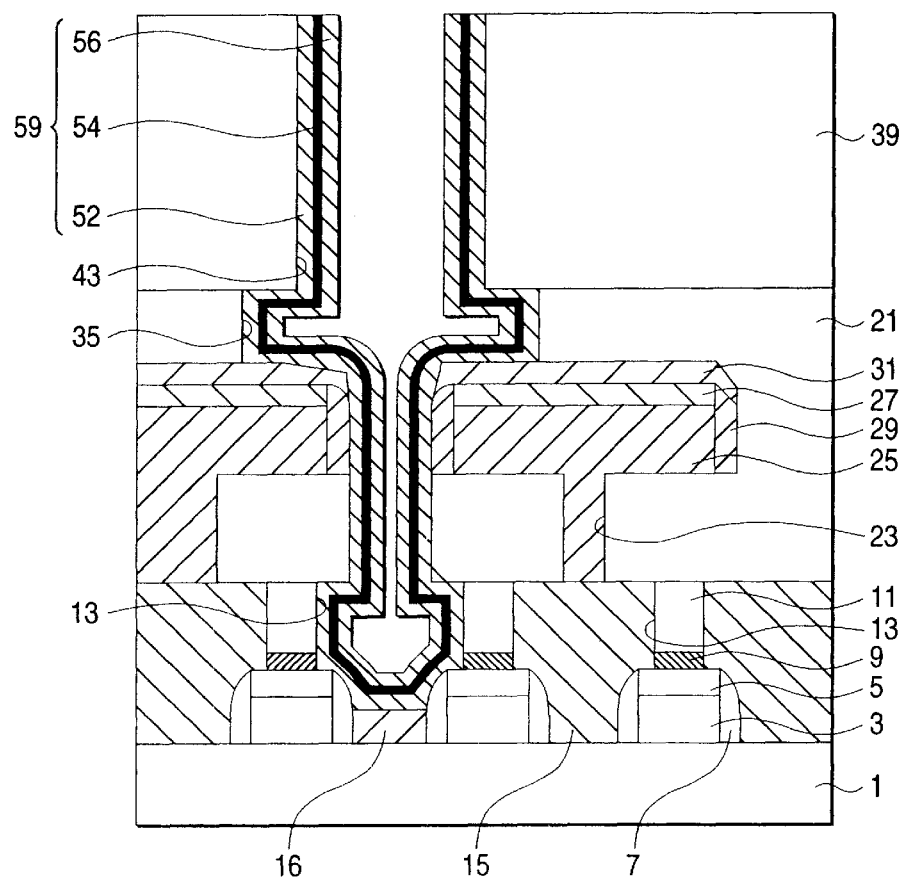
FIG. 1 is a sectional view of a semiconductor device according to the first embodiment of the present invention.
Figure 1B:
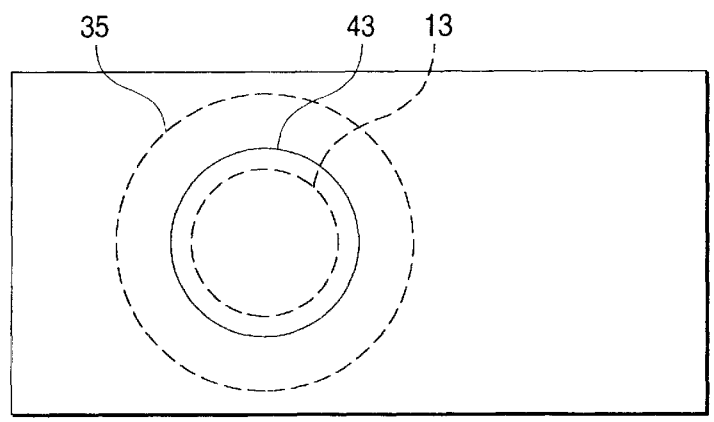

FIGS. 1A and 1B are a structural section view showing a portion of a semiconductor device according to a first embodiment of the invention and a plan view thereof, respectively. Referring to these figures, the embodiment 1 will be explained. In the figures used to explain respective embodiments, like reference numerals refer to like or corresponding portions in order to omit the explanation.

Referring to FIG. 1A, a gate wiring(s) 3 is formed as a first wiring on a semiconductor substrate 1 through a gate insulating film not shown. On an upper surface and side surface of the gate wiring 3, a silicon oxide film 5 and a nitride side wall film 7 are formed, respectively. Further, on the oxide film 5, an etching stopper film 9 is formed. On the gate wiring 3, an insulating film 11 having an opening(s) 13 which reaches the semiconductor substrate 1 is formed through these insulating films as a first insulating layer.

The first openings 13 are filled with conductive layers 15 and 16. The conductive layer 15 is entirely embedded in the opening 13, and electrically connects an overlying bit wiring 25 to the semiconductor substrate 1. On the other hand, the conductive layer 16 is embedded halfway into the opening 13, and electrically connects an overlying capacitor 59 to the semiconductor substrate 1.

On the insulating film 11, an interlayer insulating film 21 is formed as a second insulating layer including a bit wiring(s) 25 which is a second wiring. The bit wiring 25 is formed within the interlayer insulating film 21 and is embedded in the opening 23 reaching the conductive layer 15 so that the bit wiring 25 is electrically connected to the semiconductor substrate 1 through the conductive layer 15. Etching stopper films 27 and 31 are formed on an upper surface of the bit wiring 25, and a nitride side wall film 29 serving as an etching stopper film is further formed on a side wall of the bit wiring 25.

In the interlayer insulating film 21, a second opening 35 is formed which passes through between the bit wirings 25 and communicates with the first opening 13. The second opening 35 is formed to have a diameter different from that of the first opening 13 at least at their coupling portions. In FIG. 1, the second opening 35 is illustrated to have a smaller diameter than that of the first opening 13.

On the interlayer insulating film 21, an interlayer insulating film 39 is formed as a third insulating film. In the interlayer insulating film 39, a third opening 43 which is cylindrical is formed to communicate with the second opening 35. The cylindrical opening 43 is formed to have a diameter different from that of the opening 35 at least at their coupling portions. In FIG. 1, the opening 43 is illustrated to have a smaller diameter than that of the opening 35.

In the first opening 13, second opening 35 and third opening 43 and on the conductive film 16, a capacitor 59 comprising a capacitor lower electrode 52, a capacitor dielectric film 54 and a capacitor upper electrode 53 which are successively stacked, is formed to extend along their surfaces.

The semiconductor device according to the first embodiment is structured as described above.

Referring to sectional views showing a manufacturing process in FIGS. 2 to 15, an explanation will be given of a method of manufacturing the semiconductor device described above.

Figure 2:
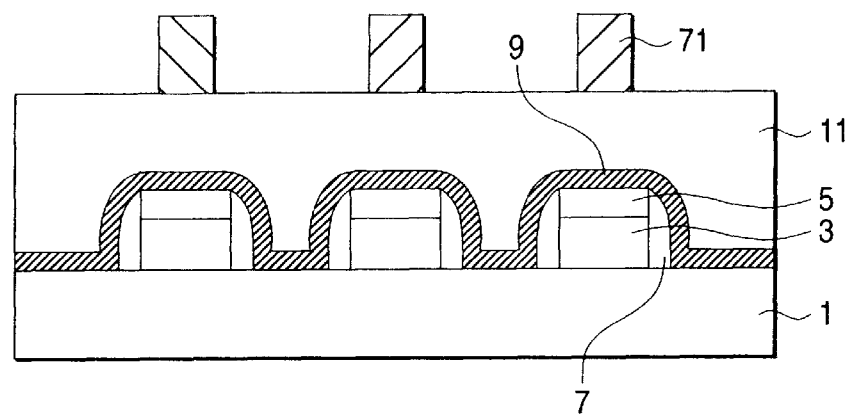
FIG. 2 is a sectional view of a step of manufacturing the semiconductor device according to the first embodiment of the invention.

First, referring to FIG. 2, on the semiconductor substrate 1 made of silicon, using the oxide film 5 as a hard mask, the gate wiring 3 made of polysilicon and such like is formed. Thereafter, the nitride side wall film 7 having a thickness of 30 nm is formed on the side surfaces of the gate wiring 3 and the oxide film 5.

On the semiconductor substrate 1 are successively formed the etching stopper film 9 made of a nitride film having a thickness of 15 nm and the insulating film 11 made of a BPTEOS (Boro-Phospho-Tetra-Ortho-Silicate) oxide film having a thickness of 500 nm by CVD. On the resultant substrate surface, a resist film 71 having a prescribed pattern is formed.

Figure 3:
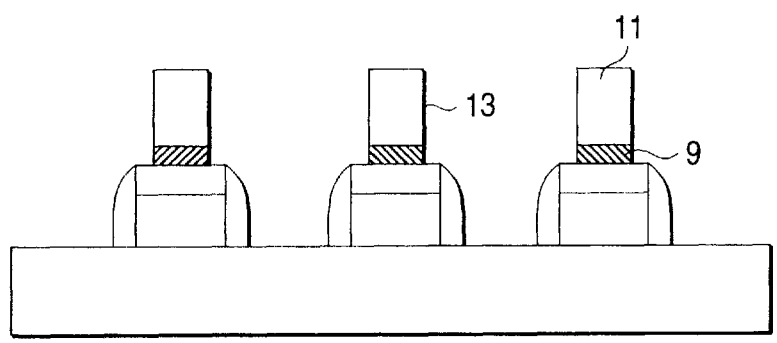
FIG. 3 is a sectional view of a step of manufacturing the semiconductor device according to the first embodiment of the invention.

Referring to FIG. 3, using the resist film 71 as a mask, the insulating film 11 is etched to provide a select ratio of 40 or more to the underlying etching stopper film 9 by dry etching using a mixed gas of $C_4F_8/CH_2F_2/CO/Ar$. Thereafter, the etching stopper film 9 is etched to expose the semiconductor substrate 1 under the condition of providing a select ratio of 5 or so to the semiconductor substrate 1 so that the first openings 13 are formed.

In this case, owing to dry etching, a modified layer is formed on the exposed surface of the semiconductor substrate 1. The modified layer is removed by etching the semiconductor substrate by a thickness of 10 nm or so under the dry etching condition for the oxide film using a mixed gas of $CF_4/O_2/Ar$.

The resist film 71 is removed after the openings have been formed.

Figure 4:
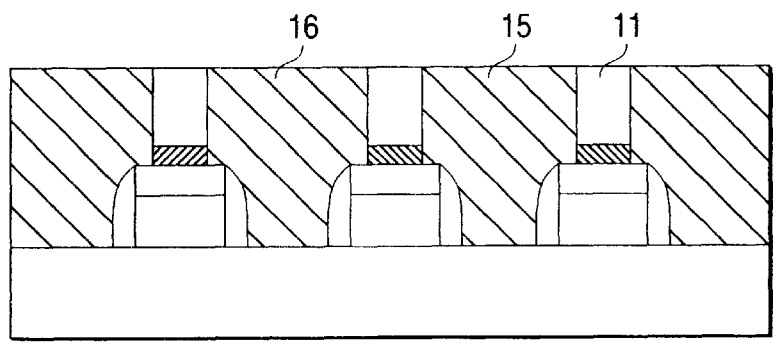
FIG. 4 is a sectional view of a step of manufacturing the semiconductor device according to the first embodiment of the invention.

Referring to FIG. 4, a phosphorus-doped amorphous silicon film is formed on the insulating film 11 by CVD so as to be embedded into the openings 13. Thereafter, the amorphous silicon film is embedded into each of the first openings 13 by the etch-back technique or CMP (Chemical Mechanical Polishing) technique, thereby forming conductive layers 15 and 16.

Figure 5:
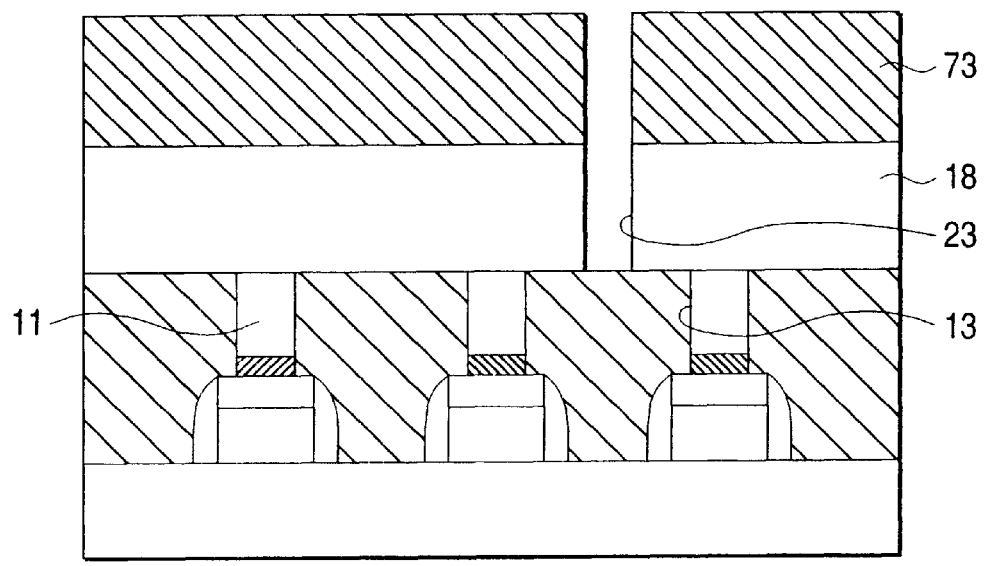
FIG. 5 is a sectional view of a step of manufacturing the semiconductor device according to the first embodiment of the invention.

Referring to FIG. 5, an insulating film 18 made of TEOS or BPTEOS having a thickness of 100–300 nm is formed on the insulating film 11 by CVD. Then, on the insulating film 18, a resist film 73 having a prescribed pattern is formed. Using the resist film 73 as a mask, the insulating film 18 is etched to form the opening 23 which reaches the conductive layer 15.

Figure 6:
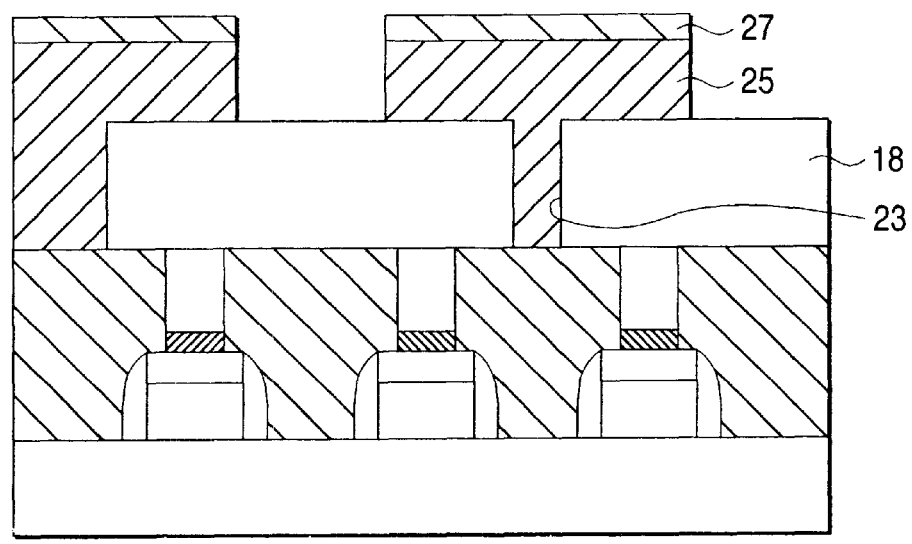
FIG. 6 is a sectional view of a step of manufacturing the semiconductor device according to the first embodiment of the invention.

Referring to FIG. 6, the bit wiring 25 made of a tungsten film is formed on the insulating film 18 so that the wiring 25 is embedded in the opening 23. On the bit wiring 25, the etching stopper film 27 made of a nitride film having a thickness of 50 nm to 200 nm is formed.

The bit wiring 25 may be made of a conductive film such as polysilicon instead of the tungsten film.

Figure 7:
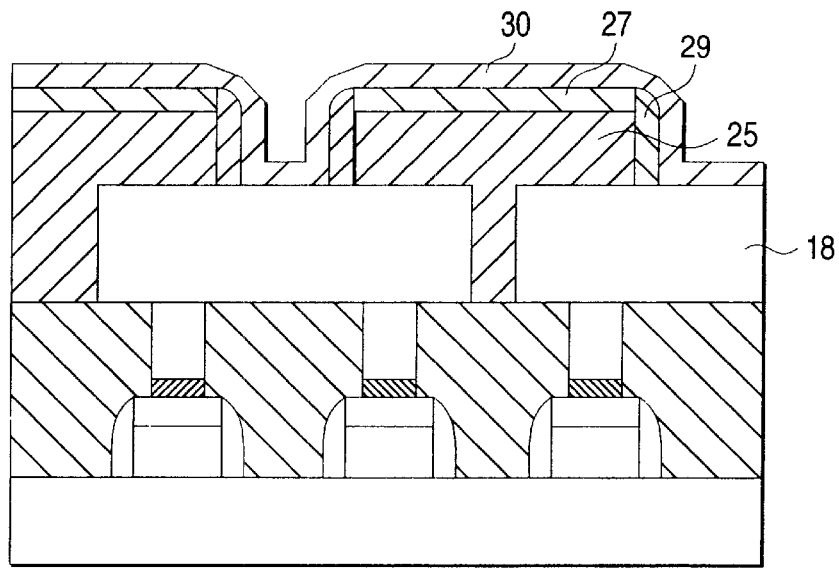
FIG. 7 is a sectional view of a step of manufacturing the semiconductor device according to the first embodiment of the invention.

Referring to FIG. 7, a nitride film having a thickness of 50 nm is formed on an entire surface of the insulating film 18 to cover the bit wiring 25. The nitride film is subjected to anisotropic dry etching using a mixed gas of $CF_4/CHF_3/O_2/Ar$, thereby forming a nitride side wall film 29 on a side wall of the bit wiring 25. Thereafter, an etching stopper film 30 having a thickness of 100 nm is formed on an entire surface of the bit wiring 25 through the etching stopper film 27 and the nitride side wall film 29.

Figure 8:
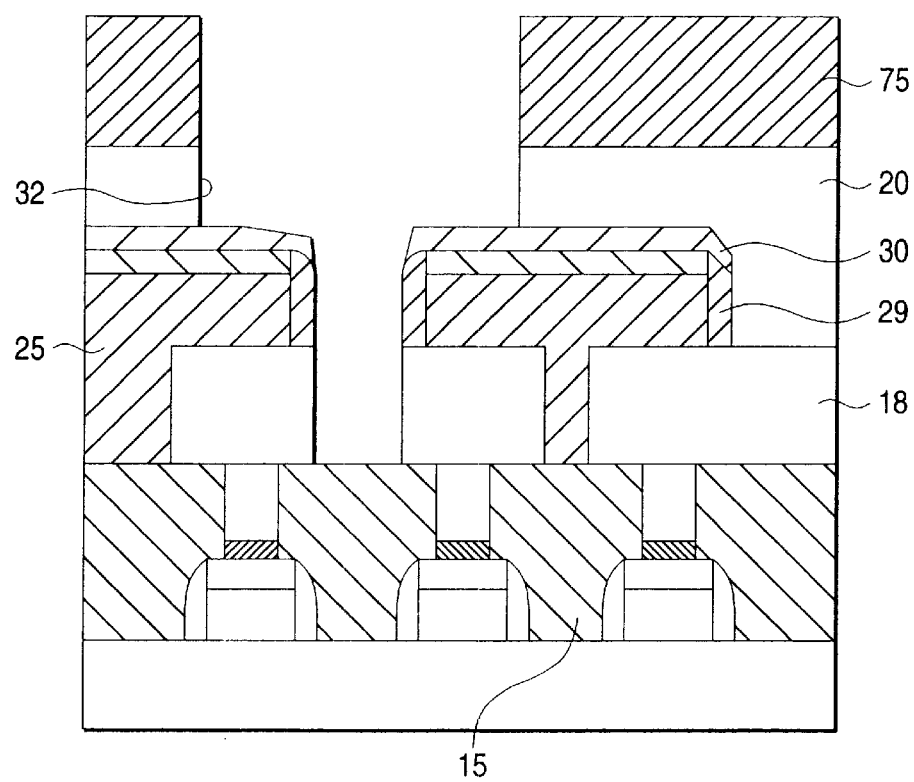
FIG. 8 is a sectional view of a step of manufacturing the semiconductor device according to the first embodiment of the invention.

Referring to FIG. 8, an insulating film 20 made of a BPTEOS oxide film is formed on the insulating film 18 by CVD so as to cover the bit wiring 25. A resist film 75 having a prescribed pattern is formed on the insulating film 20.

Thereafter, using the resist film 75 as a mask, the insulating film 20 is etched in a self-aligned manner by anisotropic dry etching using a mixed gas of $C_4F_8/CH_2F_2/CO/Ar$ to provide a select ratio of 40 or so to the etching stopper film 30. Subsequently, using the resist film 75 as a mask, the etching stopper film 30 is etched so as to expose the surface of the insulating film 18 under the condition of minimizing the film reduction in the nitride film at a shoulder of the bit wiring 25, thereby forming an opening 32.

Figure 9:
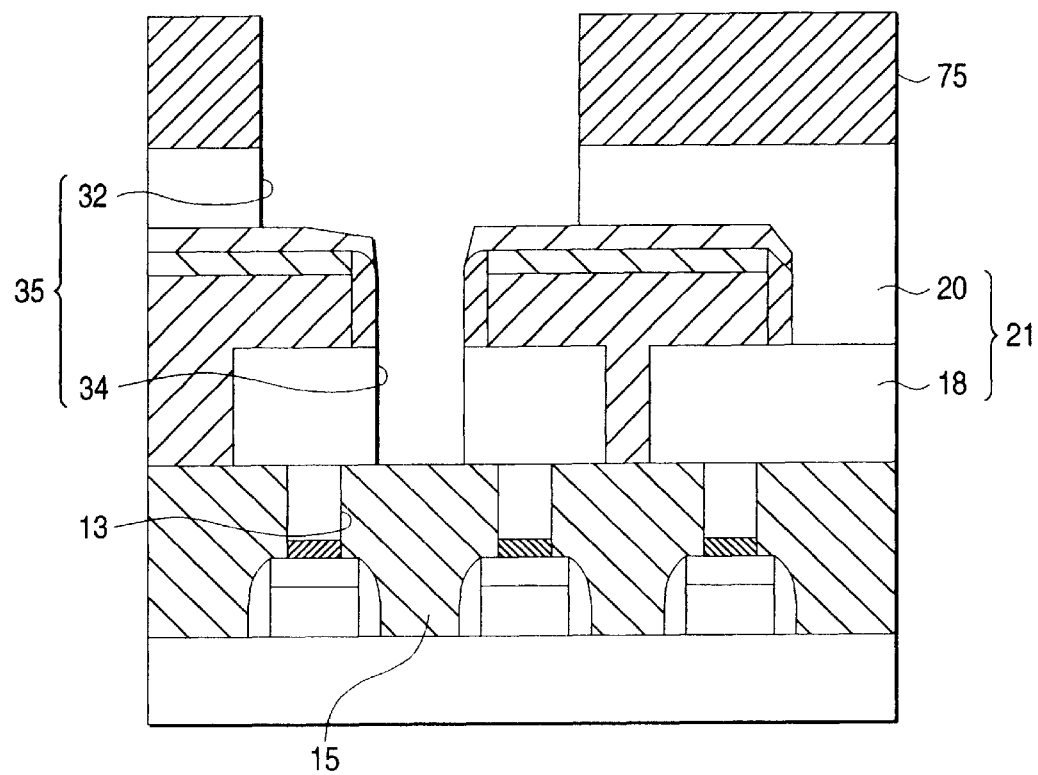
FIG. 9 is a sectional view of a step of manufacturing the semiconductor device according to the first embodiment of the invention.

Referring to FIG. 9, subsequently to the above etching, using the resist film 75, the etching stopper 30, and nitride film side wall 29 as a mask, the insulating film 18 is etched in a self-aligned manner so as to expose the surface of the conductive film 15 by the anisotropic dry etching using a mixed gas of $C_4F_8/CH_2F_2/CO/Ar$, thereby forming an opening 34. Thus, the second opening 35 including the opening 32 and opening 34 is formed in the interlayer insulating film 21.

In this case, although a modified layer due to etching is formed on the surface of the conductive layer 15, in this embodiment, it is not necessary to remove the modified layer at this stage for the reason described later. The opening 35 is formed to have a different diameter from that of the opening 13 at least at the coupling portion with the opening 13. In FIG. 9, the diameter of the opening 35 is illustrated to have a smaller diameter than that of the opening 13.

Figure 10:
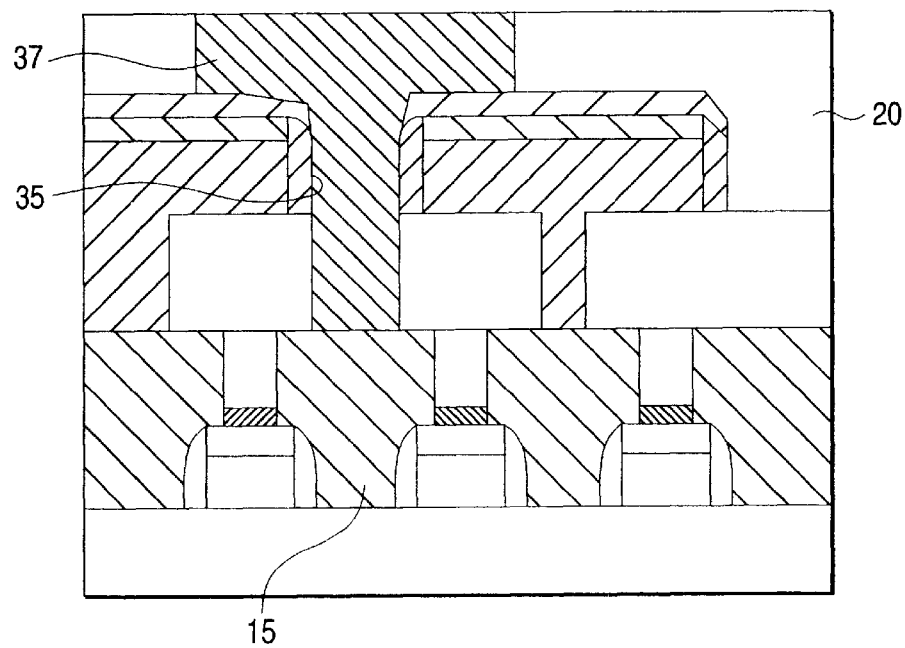
FIG. 10 is a sectional view of a step of manufacturing the semiconductor device according to the first embodiment of the invention.

Referring to FIG. 10, a phosphorus-doped amorphous silicon film is formed on the insulating film 20 by CVD so as to fill the opening 35. Thereafter, the amorphous silicon film is embedded in the opening 35 by the etch-back or CMP technique, thereby forming a second conductive layer 37.

Figure 11:
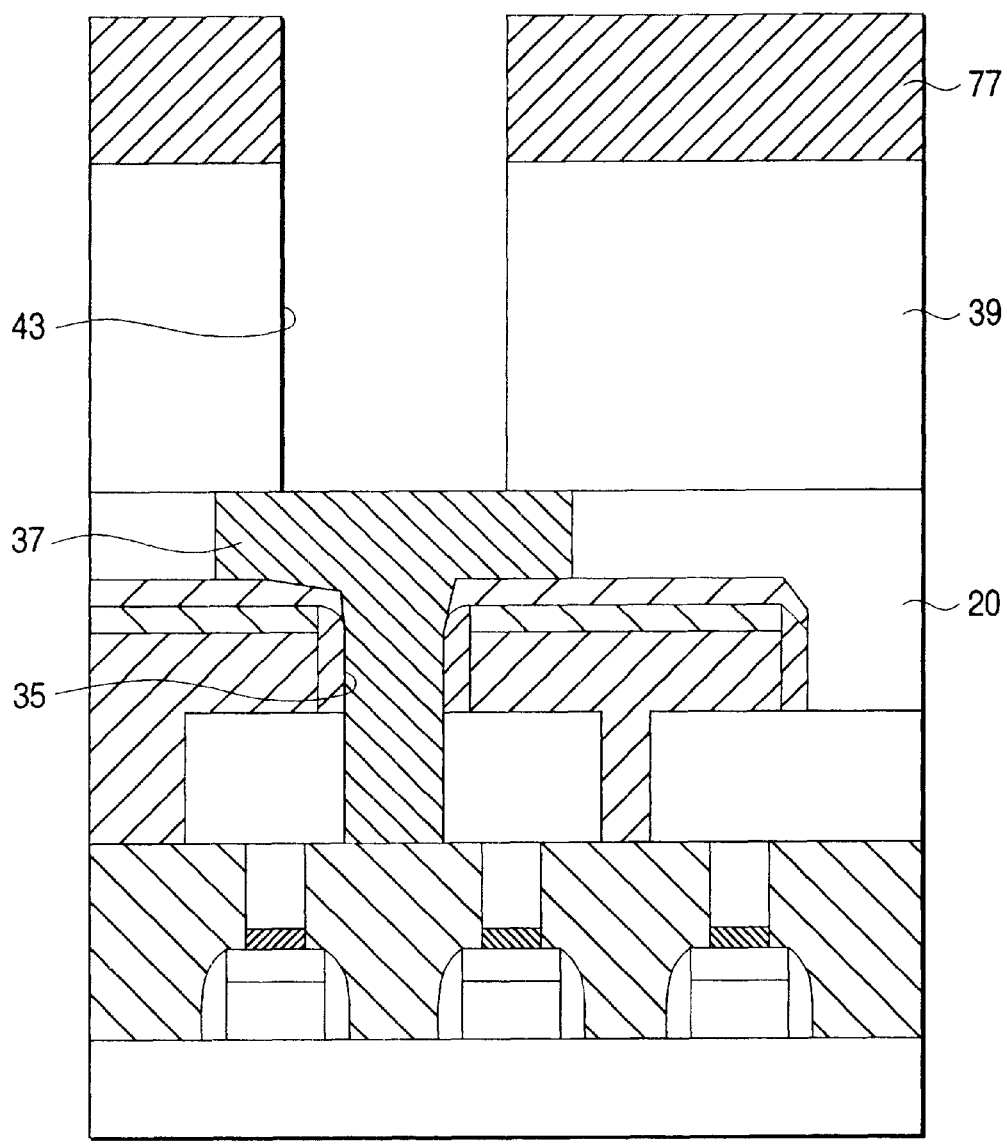
FIG. 11 is a sectional view of a step of manufacturing the semiconductor device according to the first embodiment of the invention.

Referring to FIG. 11, the insulating film 39 made of a BPTEOS film having a thickness of 1.5 $\mu$m is formed on the insulating film 20 by CVD. A resist film 77 having a prescribed pattern is formed on the insulating film 39. Thereafter, using the resist film 77 as a mask, a cylindrical opening 43 constituting a third opening which reaches the conductive layer 37 is formed by dry etching using a mixed gas of $C_4F_8/CH_2F_2/CO/Ar$.

In this case, although a modified layer is formed due to dry etching on a surface of the conductive layer 37, its removal is not required at this stage.

Incidentally, the opening 43 is formed to have a different diameter from a diameter of the opening 35 at least at the coupling portion with the opening 35. In FIG. 11, the diameter of the opening 43 is illustrated to have a smaller diameter than that of the opening 35.

Figure 12:
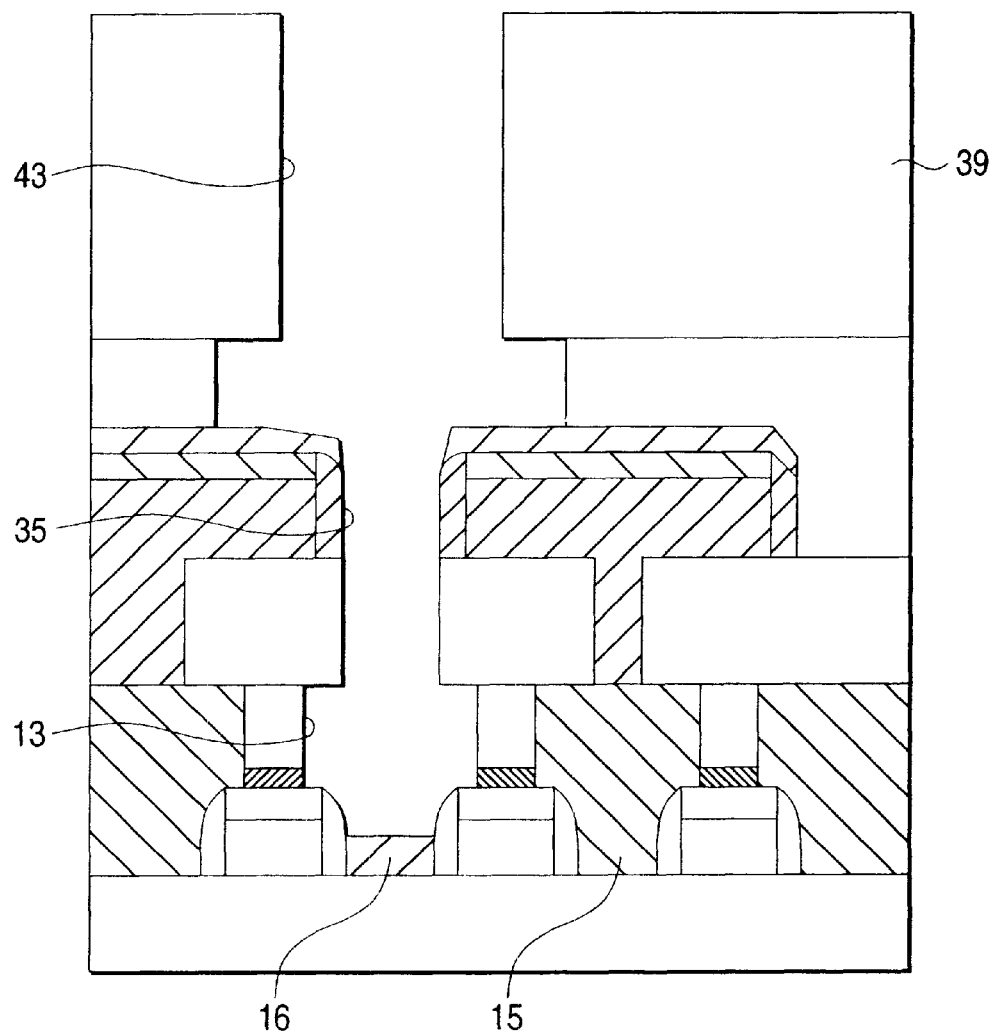
FIG. 12 is a sectional view of a step of manufacturing the semiconductor device according to the first embodiment of the invention.

Referring to FIG. 12, the conductive layer 37 and the conductive layer 15 are etched away through the opening 43 of the insulating film 39 using an etching solution such as a hydrated ammonia and an ammonia solution heated to about 70° C. or isotropic dry etching. In this case, it is desired to leave a certain amount of the conductive layer 16 in order to prevent the surface of the semiconductor substrate 1 from being exposed and the semiconductor substrate 1 from being etched by the etching solution. This is because etching of the semiconductor substrate 1 may spoil the electric stability between the semiconductor substrate and the capacitor lower electrode described later.

Therefore, in order to leave a certain amount of the conductive layer 16 with great accuracy, it is important to adjust the temperature, concentration, etc. of the etching solution suitably so that the etching rate and its uniformity are stabilized.

Since the conductive layer 37 and conductive layer 15 are removed by this etching, at the steps described above, it was not necessary to remove the modified layer created on the conductive layer 15 when the opening 34 is formed and the modified layer created on the conductive layer 37 when the opening 43 is formed. Inversely, the conductive layer 15 may be etched so as to remove at least the modified layer created on the surface thereof.

It should be noted that as the etching amount of the conductive layer 15 increases, the surface area of the opening 13 increases so that the capacitor area described later increases.

Figure 13:
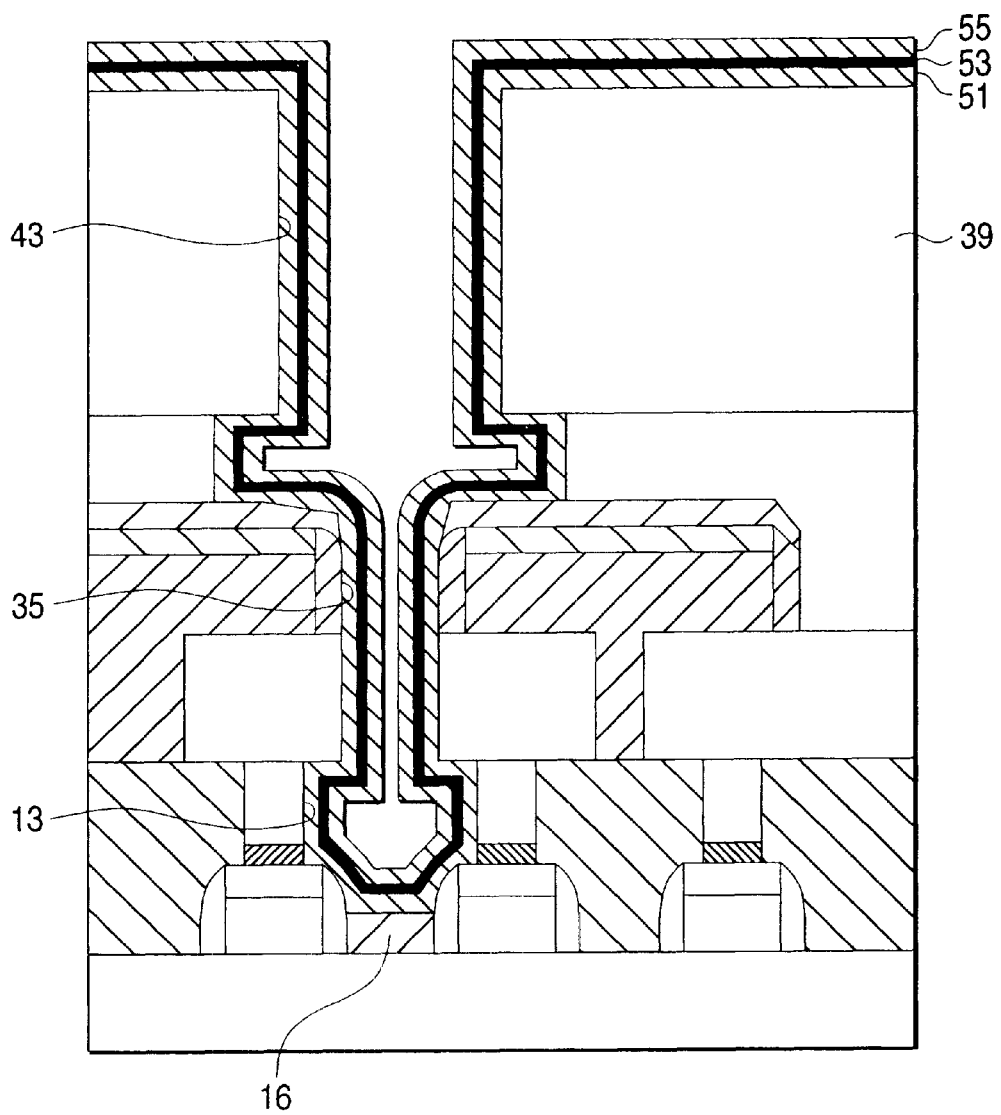
FIG. 13 is a sectional view of a step of manufacturing the semiconductor device according to the first embodiment of the invention.

Referring to FIG. 13, a polysilicon film 51, oxide/nitride film 53 and polysilicon film 55 are successively formed to extend on a surface of the conductive layer 16, along an inner walls of the openings 13, 35 and 43 and on the insulating layer 39.

Finally, referring to FIG. 1 again, the polysilicon film 51, oxide/nitride film 53 and polysilicon film 55 located on the insulating film 39 are removed by the CMP technique. Thus, a capacitor 59 comprising the capacitor lower electrode 52, capacitor dielectric film 54 and a capacitor upper electrode 56 is formed to complete a semiconductor device.

Incidentally, the capacitor 59 may be formed by following method.

Figure 14:
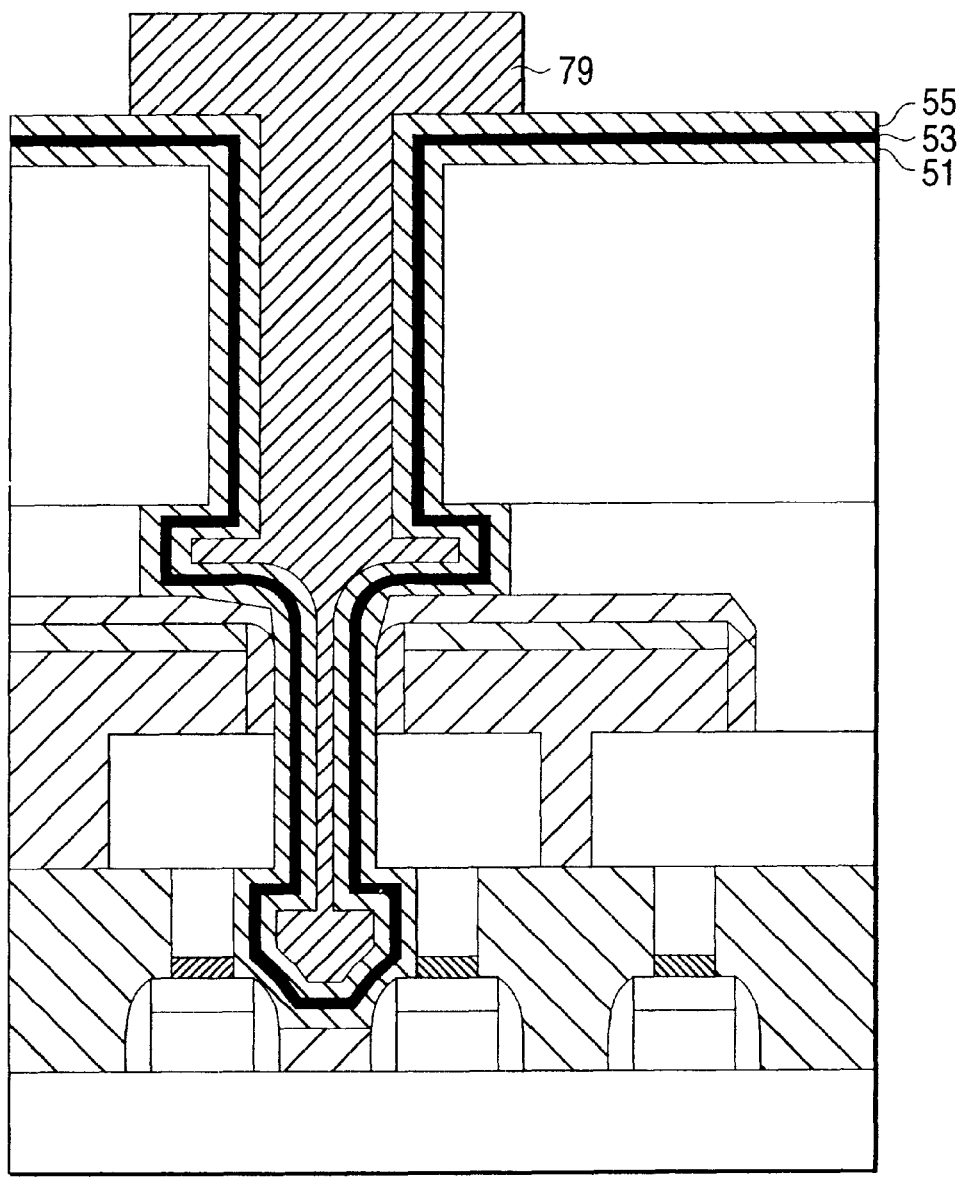
FIG. 14 is a sectional view of a step of manufacturing the semiconductor device according to the first embodiment of the invention.

Referring to FIG. 14, a resist film 79 having a prescribed pattern is formed on the polysilicon film 55 to fill the openings 13, 35 and 43.

Figure 15:
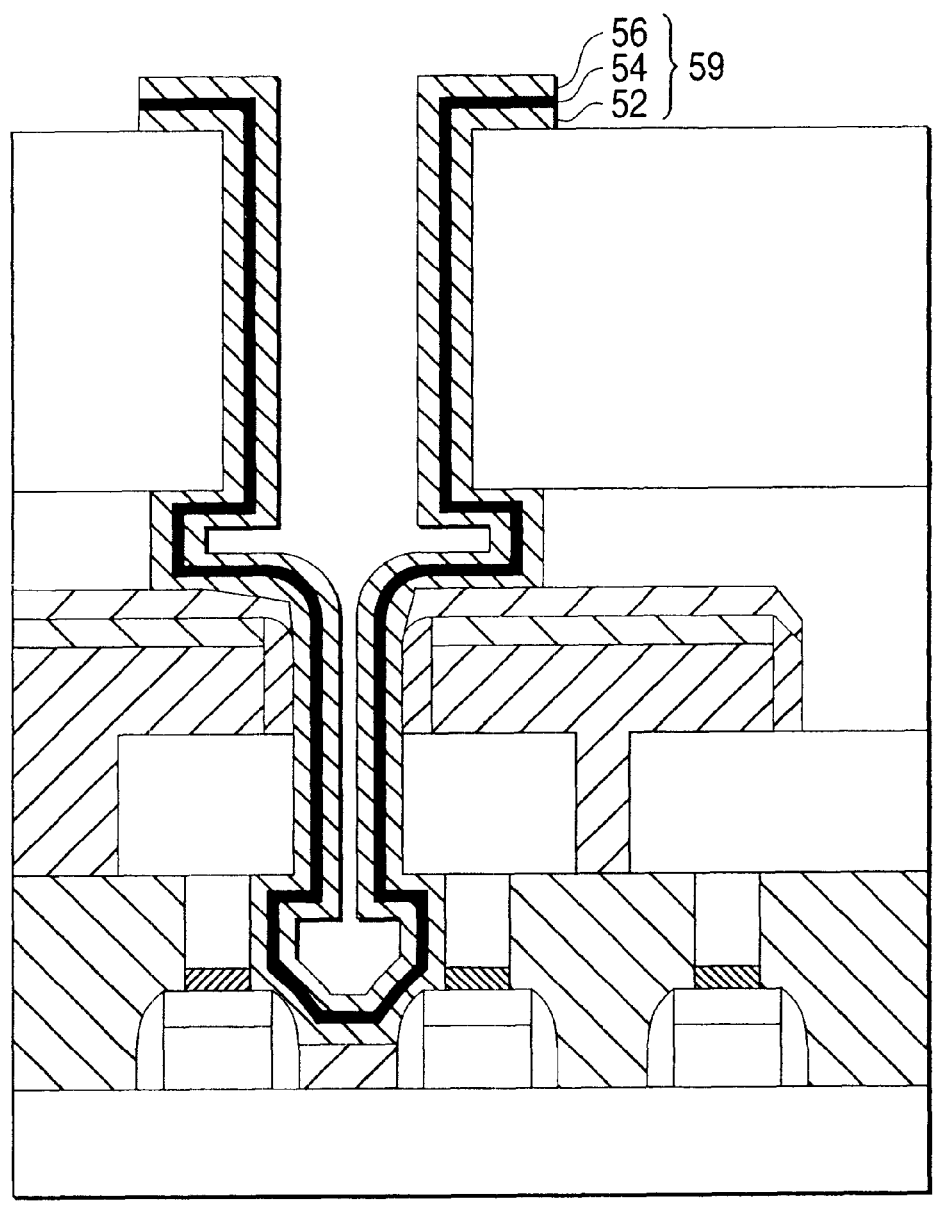
FIG. 15 is a sectional view of a step of manufacturing the semiconductor device according to the first embodiment of the invention.

Referring to FIG. 15, using the resist film 79 as a mask, the polysilicon film 51, oxide/nitride film 53 and polysilicon film 55 are successively etched. Thereafter, the resist film 79 is removed to form the capacitor 59 comprising the capacitor lower electrode 52, capacitor dielectric film 54 and capacitor upper electrode 56.

As described above, in accordance with the first embodiment, the capacitor electrode is formed to succeed downwardly from the cylindrical opening where the conventional capacitor was formed, to define the openings having different diameter each other at least at their coupling portion, and to extend along the surfaces of the openings. Therefore the surface area of the capacitor electrode is increased, thereby providing a semiconductor device having a large capacitance.

In addition, the poor contact due to the modified layer created when the opening is etched can be improved, thereby providing a method capable of manufacturing the semiconductor device with high yield.

[Embodiment 2]

An explanation will be given of a second embodiment of the invention.

Figure 16A:
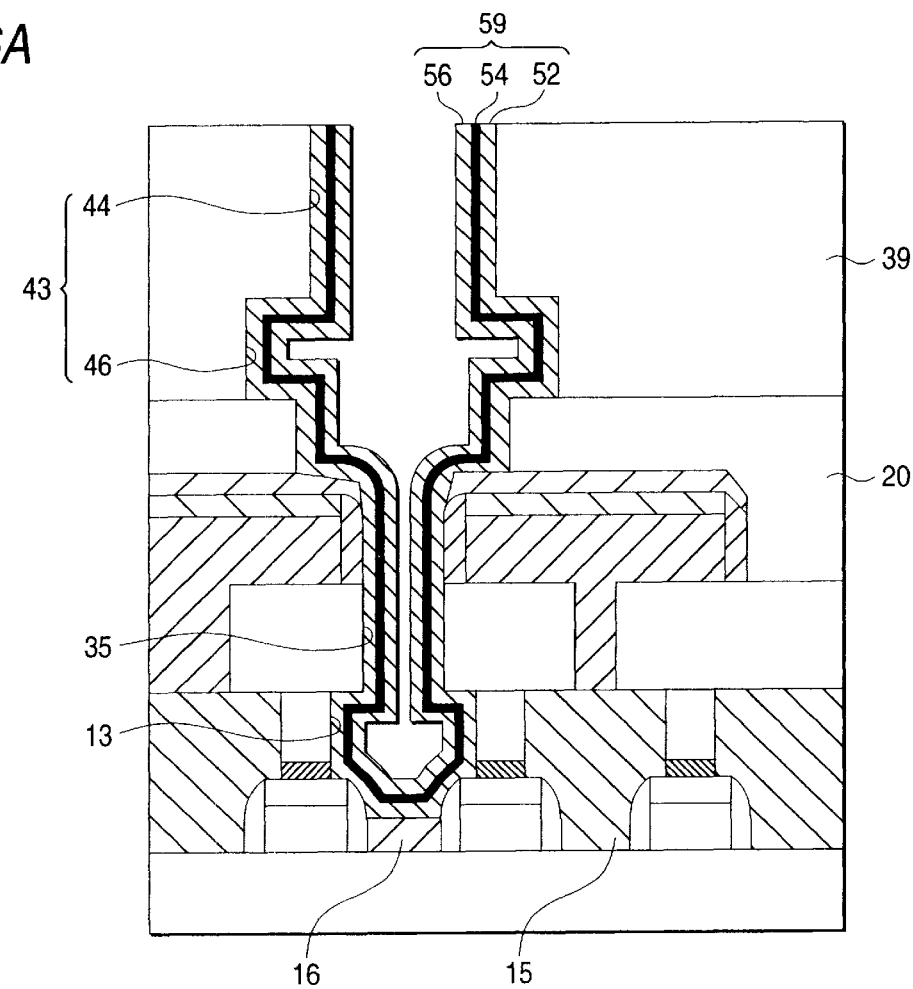
FIG. 16 is a sectional view of a semiconductor device according to the second embodiment of the present invention.
Figure 16B:
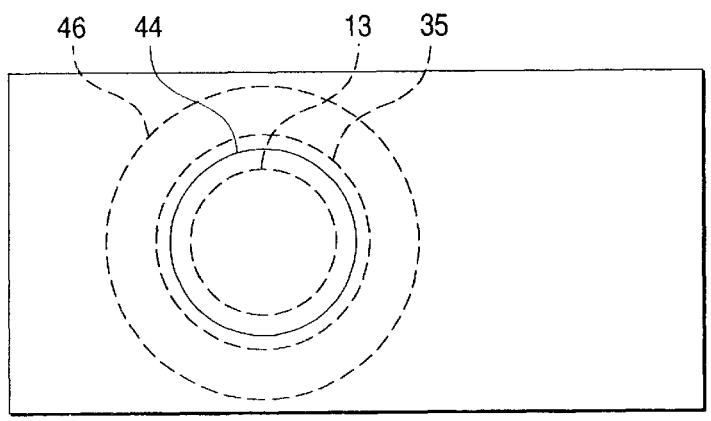

FIGS. 16A and 16B are a sectional view and a plan view showing a part of the semiconductor device according to the second embodiment of the invention, respectively.

The semiconductor device according to the second embodiment is different from that according to the first embodiment in only that the opening formed in the insulating film 39 which is the third insulating layer has a different shape.

Specifically, the opening 43 which is the third opening has a cylindrical opening 44 and an opening 46 which communicate with each other and have different diameters. As in the first embodiment, the opening 43 and the opening 35, i.e. the opening 46 and the opening 35 have different diameters at their coupling portion. In FIG. 16, the opening 46 is illustrated to have a larger diameter than that of the opening 35.

Referring to sectional views showing a manufacturing process in FIGS. 17 to 21, an explanation will be given of a method of manufacturing the semiconductor device described above.

First, according to the steps shown in FIGS. 2 to 9 with reference to the first embodiment, the members are formed to the step of forming the opening 35.

Figure 17:
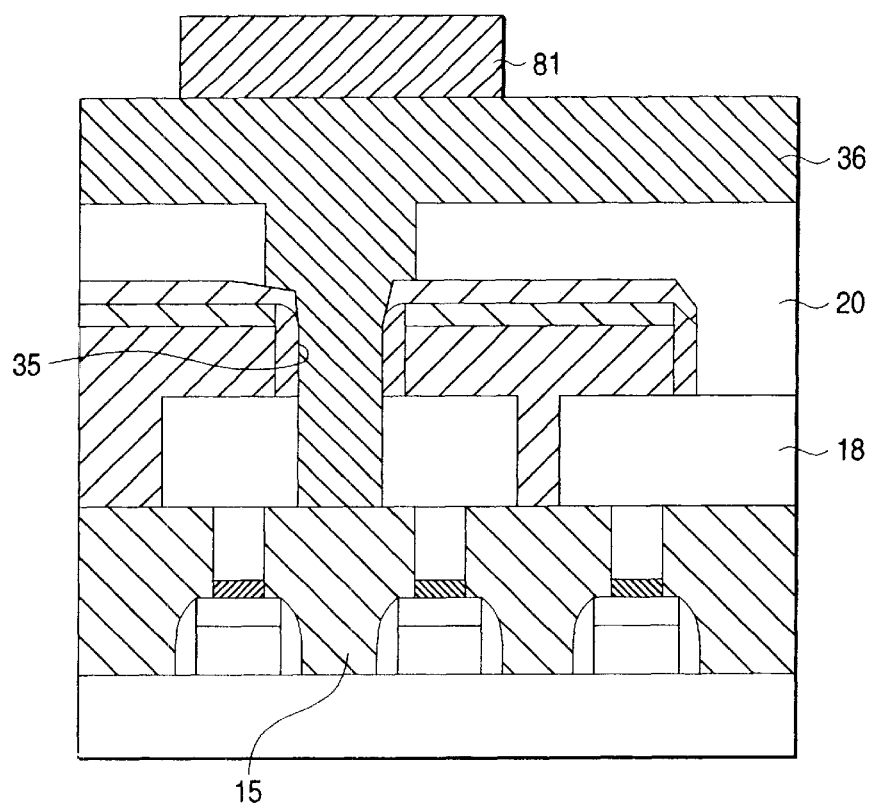
FIG. 17 is a sectional view of a step of manufacturing the semiconductor device according to the second embodiment of the invention.

Referring to FIG. 17, an phosphorus-doped amorphous silicon film 36 is formed on the insulating film 20 so as to fill the opening 35, and thereafter a resist film 81 having a prescribed pattern is formed thereon.

Figure 18:
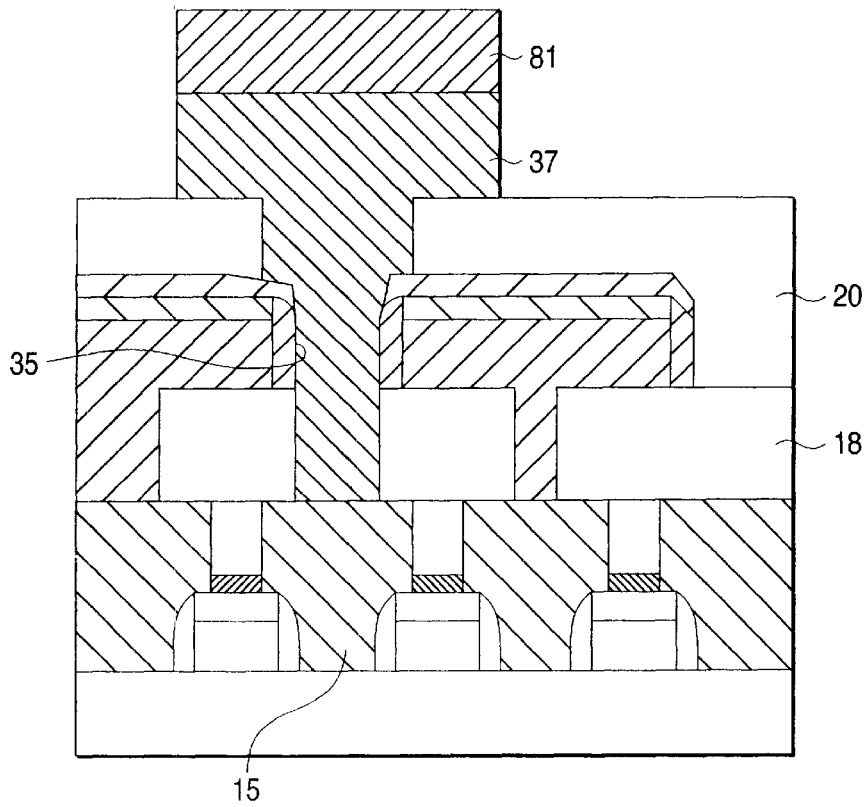
FIG. 18 is a sectional view of a step of manufacturing the semiconductor device according to the second embodiment of the invention.

Referring to FIG. 18, using the resist film 81 as a mask, the silicon film 36 is etched, thereby forming a conductive layer 37 which is embedded in the opening 35 and extends onto the opening 20.

Figure 19:
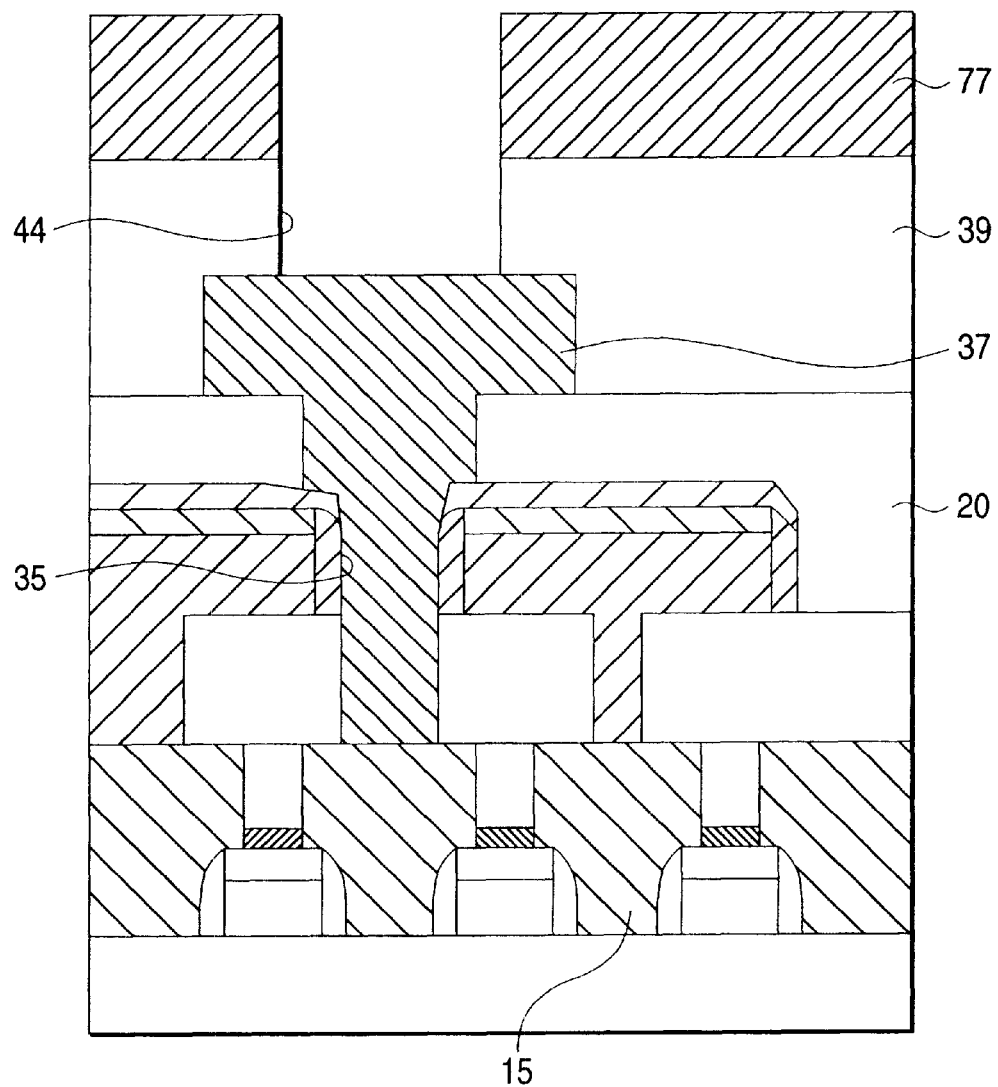
FIG. 19 is a sectional view of a step of manufacturing the semiconductor device according to the second embodiment of the invention.

Referring to FIG. 19, an insulating film 39 which is a third insulating layer made of a BPTEOS oxide film and has a thickness of 1.5 μm is formed on the insulating film 20 by CVD so as to cover the conductive layer 37. A resist film 77 having a prescribed pattern is formed on the insulating film 39. Thereafter, using the resist film 77 as a mask, the insulating film 39 is etched to form a cylindrical opening 44 which reaches the conductive layer 37. In this step, although a modified layer due to etching is formed on a surface of the conductive layer 37, removal of the modified layer is not required at this stage same as in the first embodiment.

Figure 20:
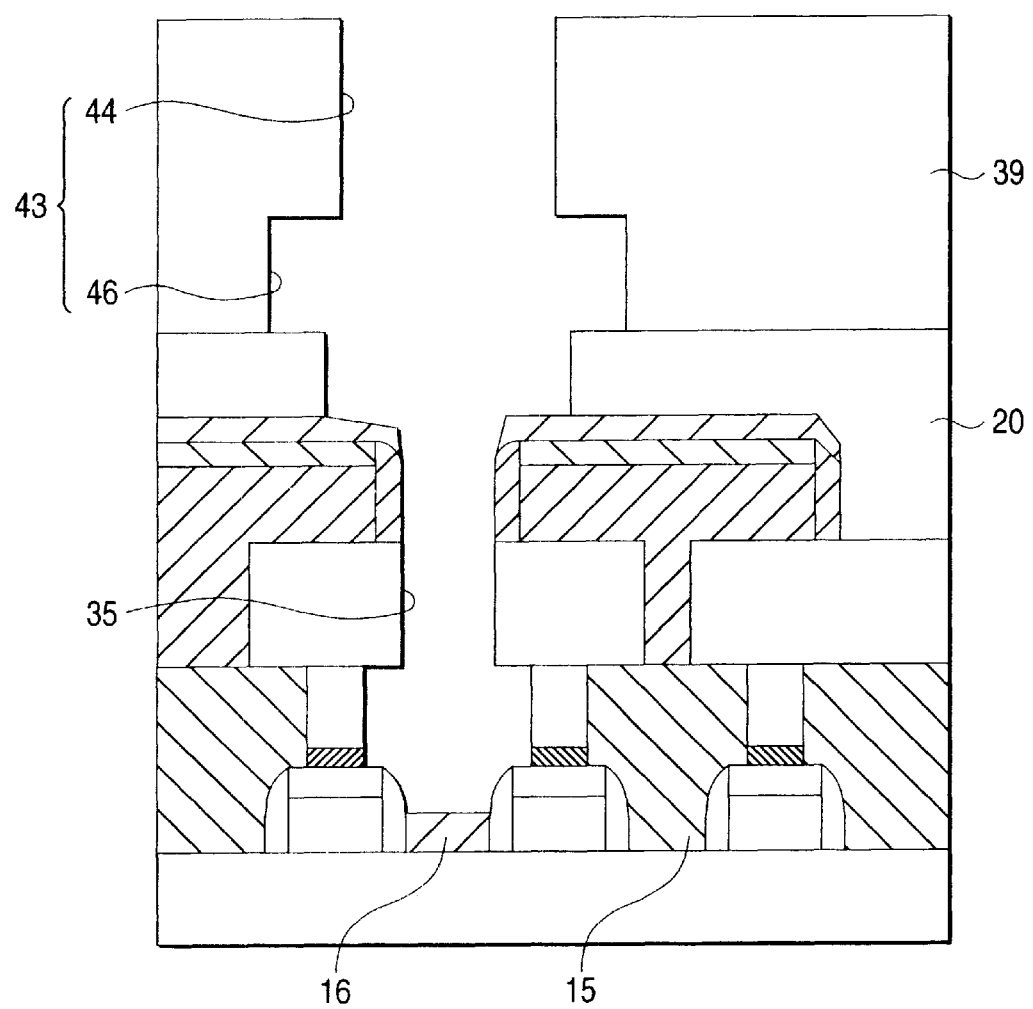
FIG. 20 is a sectional view of a step of manufacturing the semiconductor device according to the second embodiment of the invention.

Referring to FIG. 20, the conductive layer 37 and the conductive layer 15 are etched away through the opening 44 of the insulating film 39 using a hydrated ammonia and an ammonia solution heated to about 70° C. or isotropic etching using an etching gas. In this case, it is desired to leave a certain amount of the conductive layer 16 in order to prevent the surface of the semiconductor substrate 1 from being exposed and the semiconductor substrate 1 from being etched. As in the first embodiment, the conductive layer 15 may be etched so that the modified layer created on the surface of the conductive layer is removed. The opening 46 is formed simultaneously with the removal of the conductive layer 37.

Figure 21:
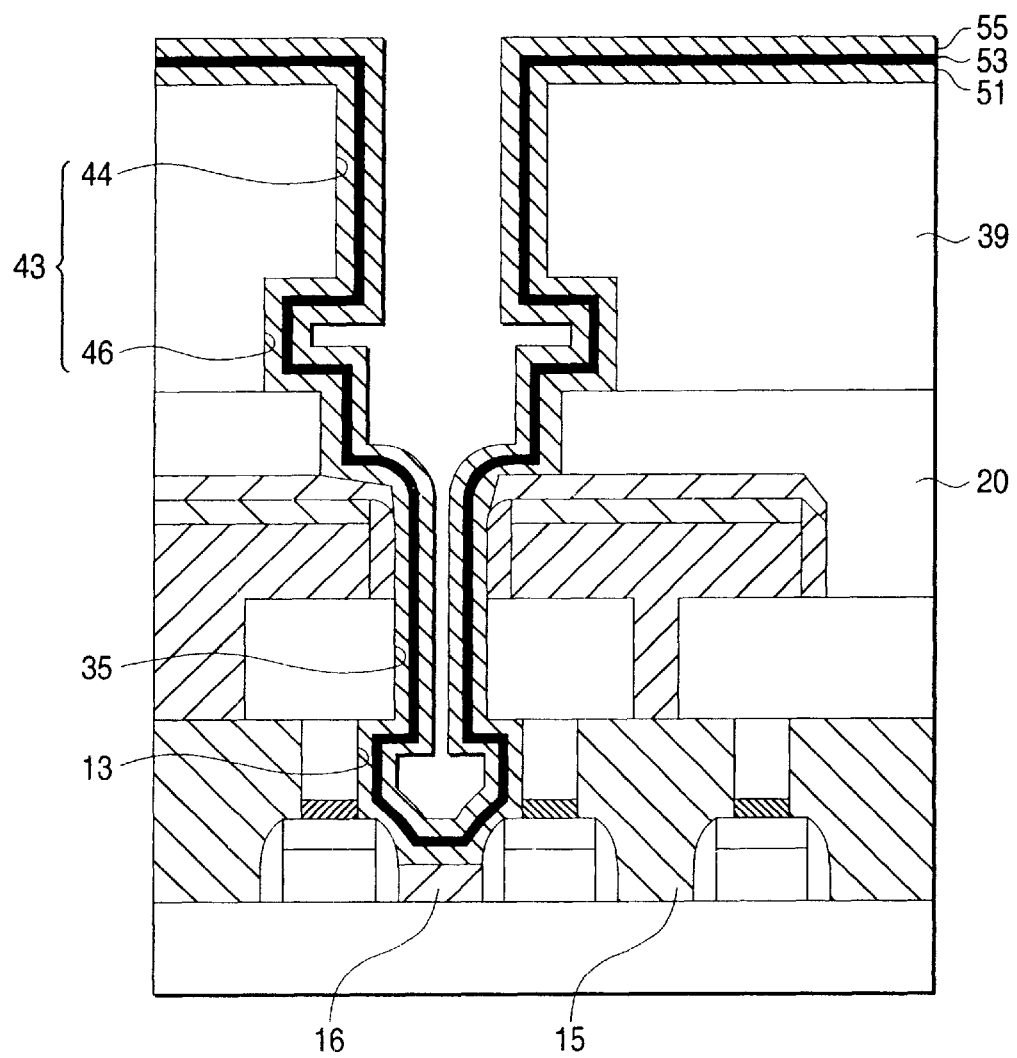
FIG. 21 is a sectional view of a step of manufacturing the semiconductor device according to the second embodiment of the invention.

Referring to FIG. 21, a polysilicon film 51, oxide/nitride film 53 and polysilicon film 55 are successively formed to extend on the surface of the conductive layer 16, along the inner walls of the openings 13, 35 and 43 and on the insulating layer 39.

Finally, referring to FIG. 16 again, the polysilicon film 51, the oxide/nitride film 53 and the polysilicon film 55 which are located on the insulating film 39 are removed by the CMP or etch-back technique. Thus, a capacitor 59 comprising the capacitor lower electrode 52, capacitor dielectric film 54 and a capacitor upper electrode 56 is formed to complete a semiconductor device.

In this case, as in the case of FIGS. 14 and 15 in connection with the first embodiment, using the resist formed so as to fill the openings as a mask, an unnecessary film may be etched to form a capacitor.

In this way, in accordance with the second embodiment, the surface area of the opening formed in the third insulating layer can be further increased, thereby providing a semiconductor device capable of assuring a large capacitor capacitance.

[Embodiment 3]

An explanation will be given of the third embodiment of the invention.

Figure 22A:
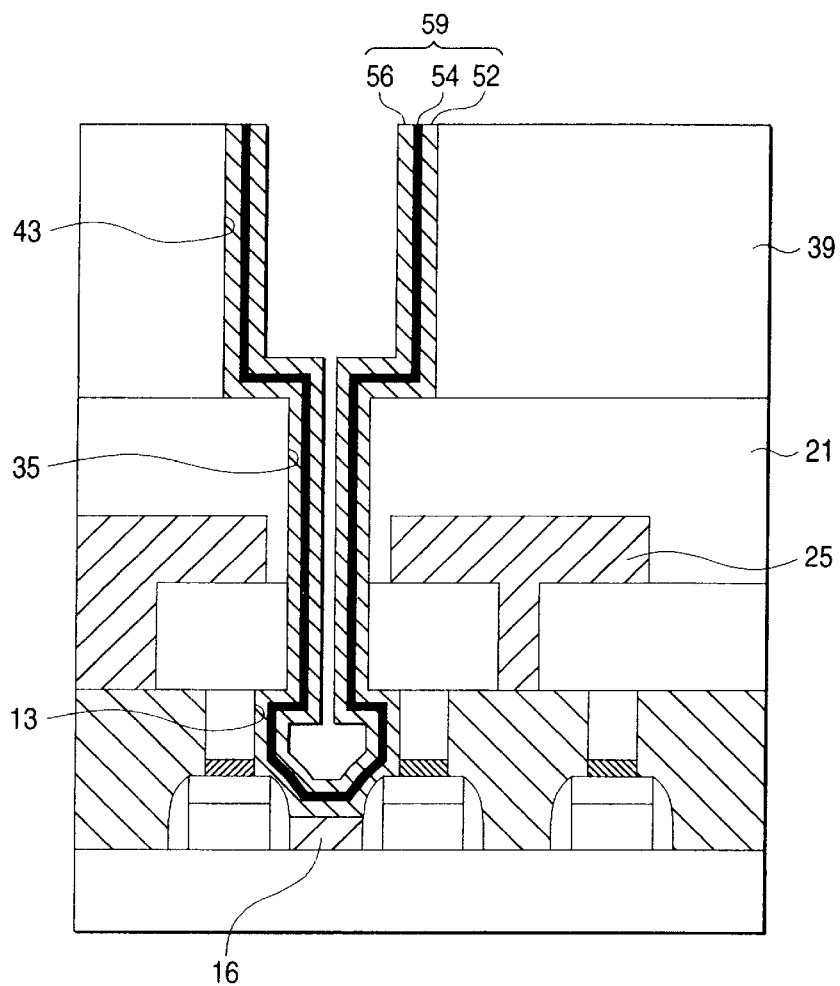
FIG. 22 is a sectional view of a semiconductor device according to the third embodiment of the present invention.
Figure 22B:
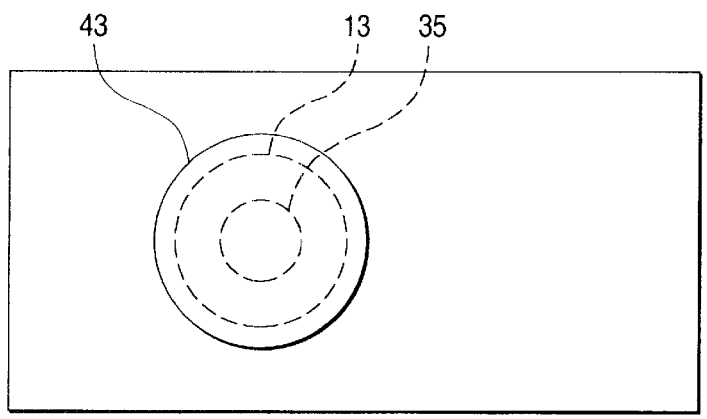

FIGS. 22A and 22B are a sectional view and a plan view showing a part of the semiconductor device according to the third embodiment of the invention, respectively.

The semiconductor device according to the third embodiment is different from that according to the first embodiment in only that the opening formed in the insulating film 21 which is the second insulating layer has a uniform cylinder shape.

Referring to FIGS. 23–28, an explanation will be given of a method of manufacturing the semiconductor device described above.

First, according to the steps shown in FIGS. 2 to 5 with reference to the first embodiment, an opening 23 which reaches the conductive layer 15 is formed in the insulating film 18.

Thereafter, a bit wiring 25 is formed to fill the opening 23.

Figure 23:
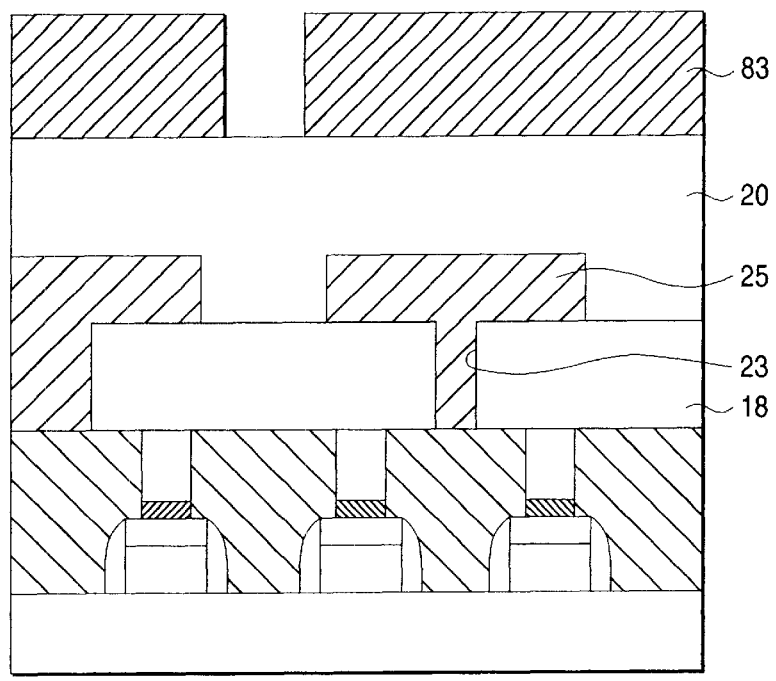
FIG. 23 is a sectional view of a step of manufacturing the semiconductor device according to the third embodiment of the invention.

Referring to FIG. 23, an insulating film 20 is formed on the insulating film 18 so as to cover the bit wiring 25. A resist film 83 having a prescribed pattern is formed on the insulating film 20.

Figure 24:
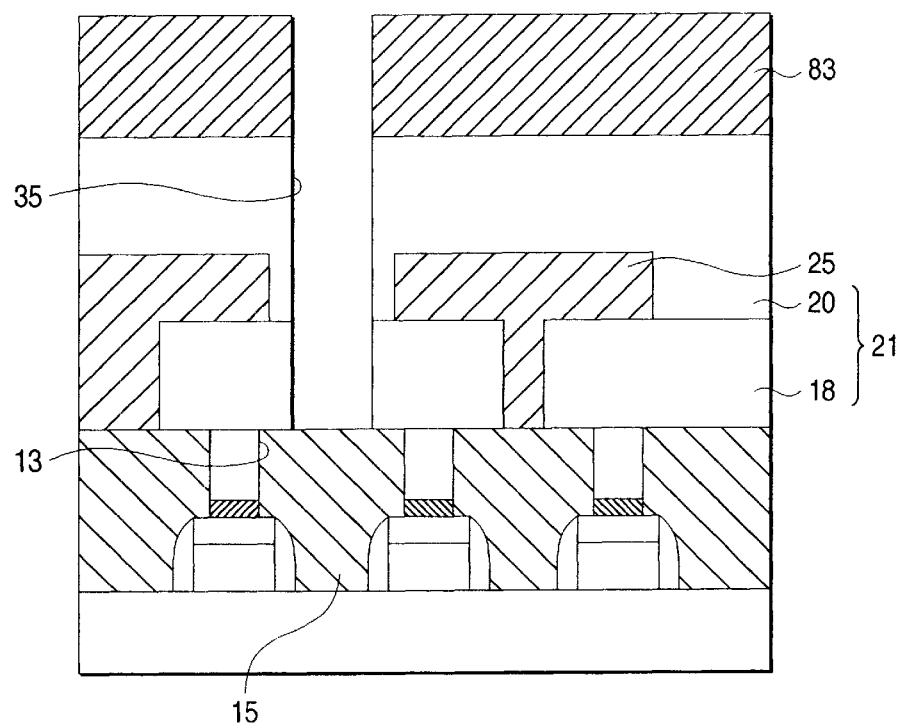
FIG. 24 is a sectional view of a step of manufacturing the semiconductor device according to the third embodiment of the invention.

Referring to FIG. 24, using the resist film 83 as a mask, the insulating film 20 and the insulating film 18 are successively etched to form a second cylindrical opening 35 which passes through the bit wiring 25 and communicates with the opening 13.

In this case, in the first embodiment, the etching stopper film was formed on the upper surface and side surface of the bit wiring 25 so that the opening 35 can be formed in a self-aligned manner. On the other hand, in accordance with this embodiment, it is not necessary to form such the etching stopper.

As in the cases of the first and the second embodiment, the opening 35 has a different diameter from that of the opening 13 in their coupling portion. In FIG. 24, the opening 35 is illustrated to have a smaller diameter than that of the opening 13.

Figure 25:
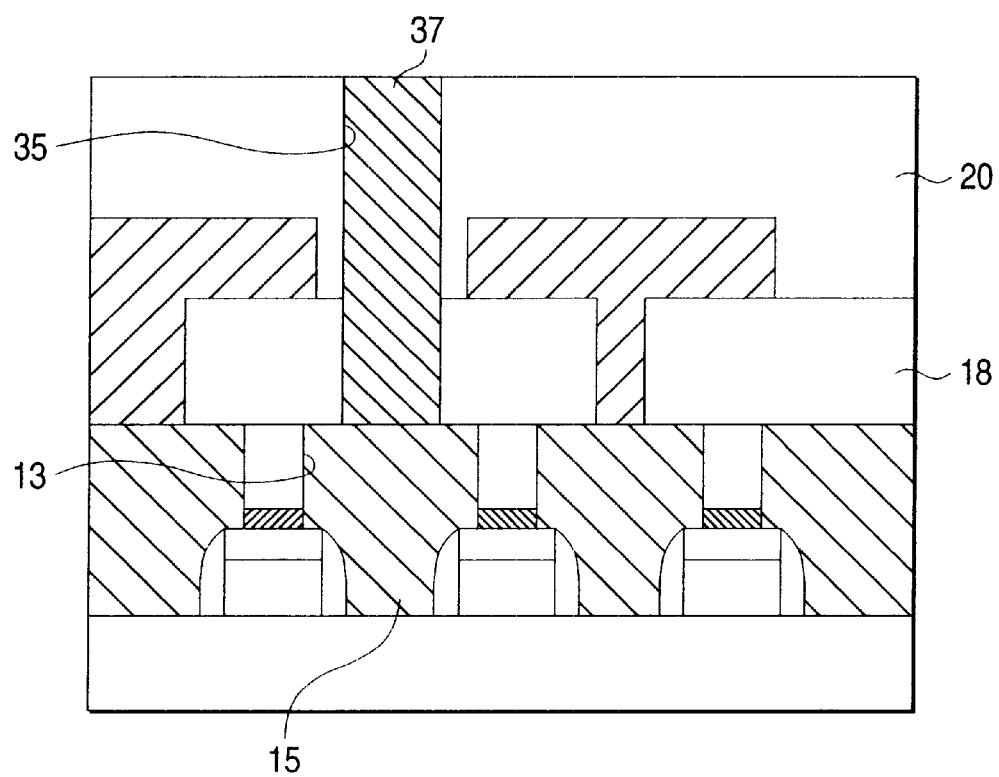
FIG. 25 is a sectional view of a step of manufacturing the semiconductor device according to the third embodiment of the invention.

Referring to FIG. 25, the opening 35 is filled with a second conductive layer 37 made of phosphorus-doped amorphous silicon.

Figure 26:
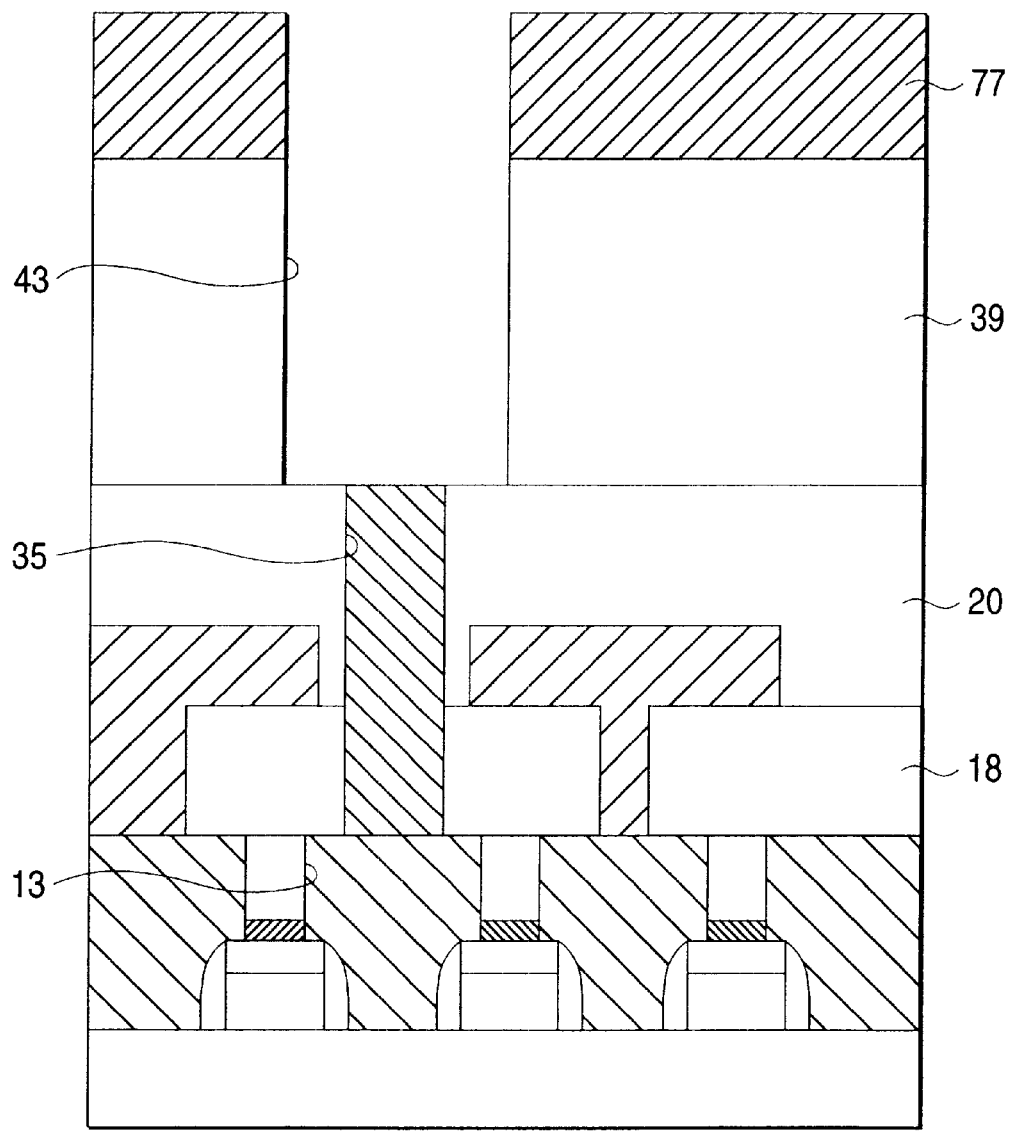
FIG. 26 is a sectional view of a step of manufacturing the semiconductor device according to the third embodiment of the invention.

Referring to FIG. 26, an insulating film 39 and a resist film 77 having a prescribed pattern are successively formed on the insulating film 20. Thereafter, using the resist film 77 as a mask, the insulating film 39 is etched to form a cylindrical opening 43 which reaches the conductive layer 37.

Figure 27:
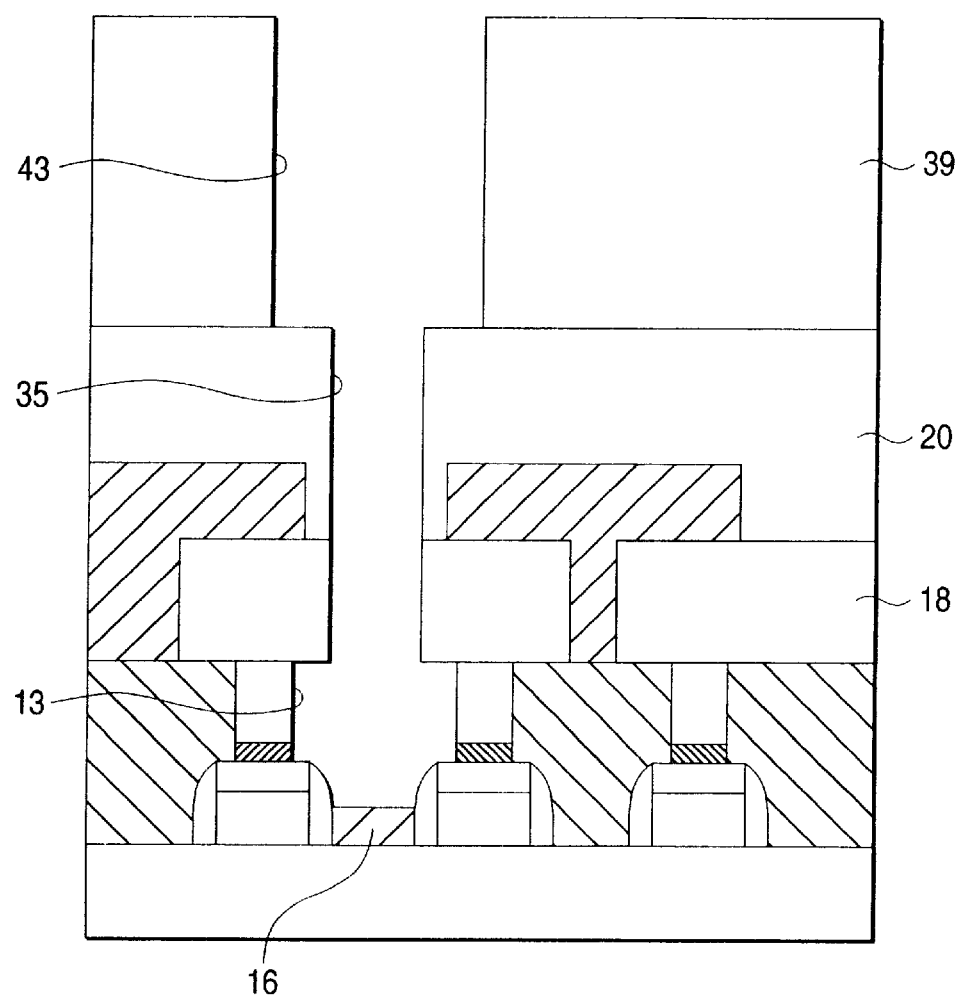
FIG. 27 is a sectional view of a step of manufacturing the semiconductor device according to the third embodiment of the invention.

Referring to FIG. 27, the conductive layer 37 and the conductive layer 15 are etched away through the opening 43 of the insulating film 39 using an etching solution such as a hydrated ammonia and an ammonia solution heated to about 70° C. or isotropic dry etching. In this case, it is desired to leave a certain amount of the conductive layer 16 in order to prevent the surface of the semiconductor substrate 1 from being exposed and the semiconductor substrate 1 from being etched.

Figure 28:
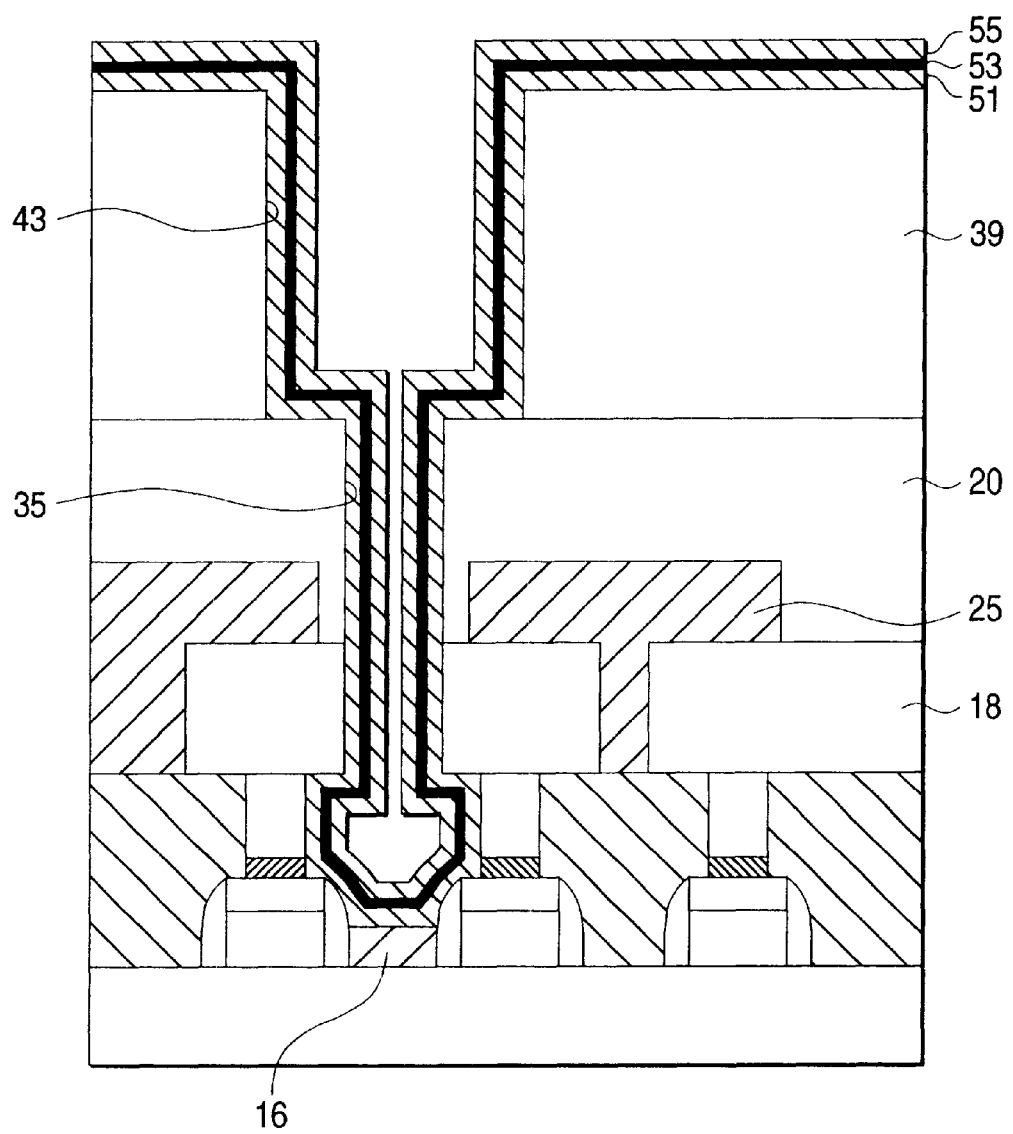
FIG. 28 is a sectional view of a step of manufacturing the semiconductor device according to the third embodiment of the invention.
Figure 29A:
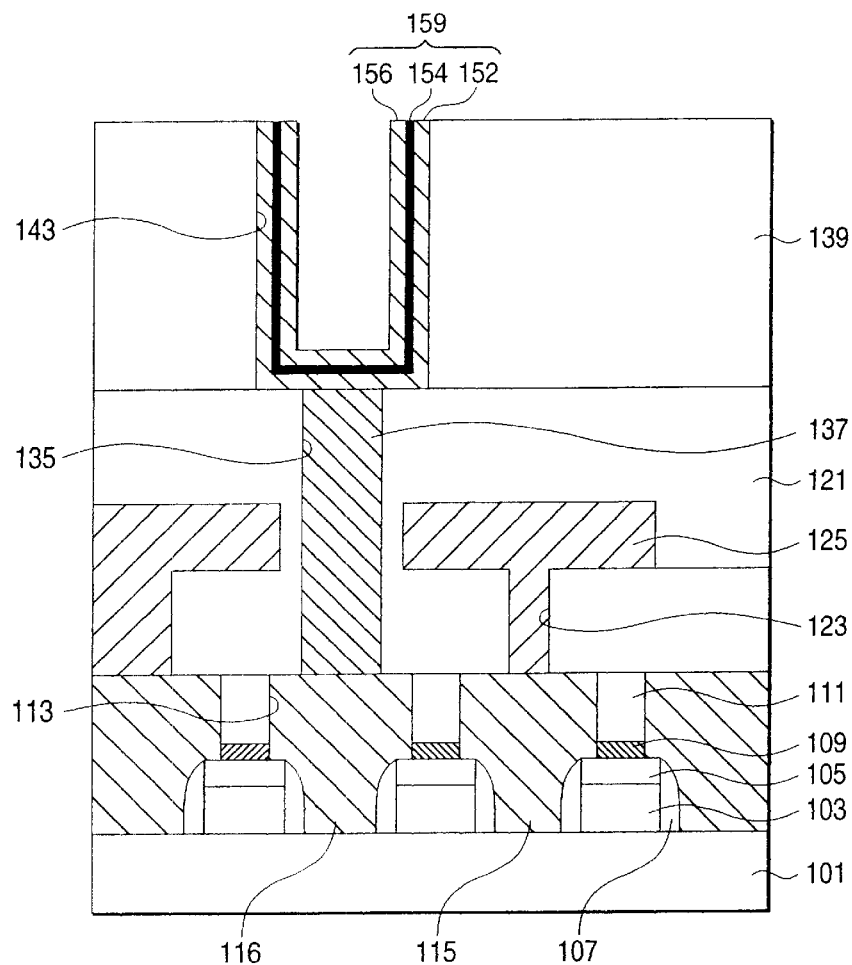
FIG. 29 is a sectional view of a conventional semiconductor device.
Figure 29B:
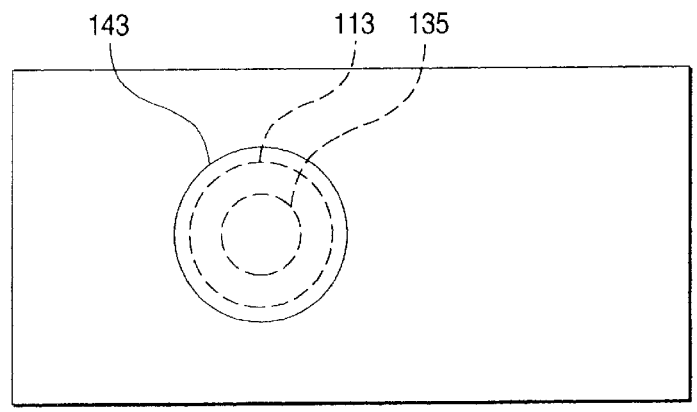
Figure 30:
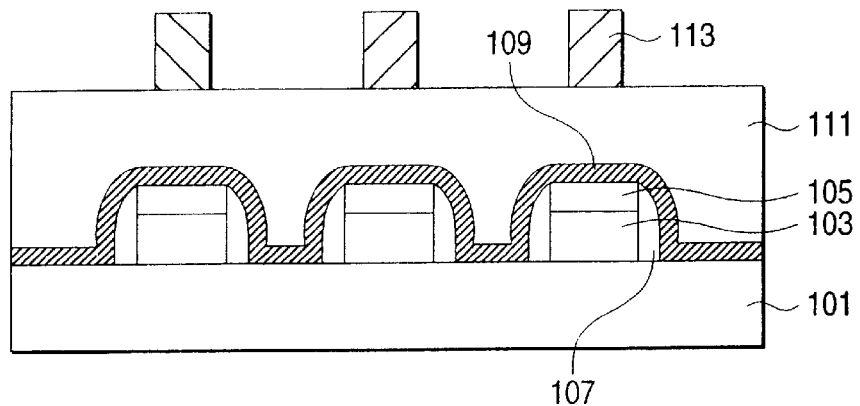
FIG. 30 is a sectional view of a step of manufacturing the conventional semiconductor device.
Figure 31:
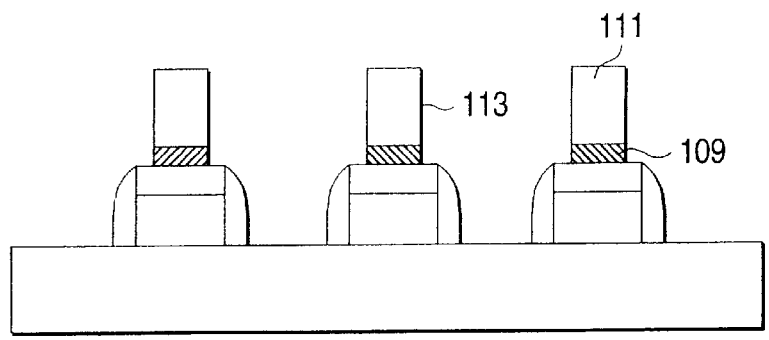
FIG. 31 is a sectional view of a step of manufacturing the conventional semiconductor device.
Figure 32:
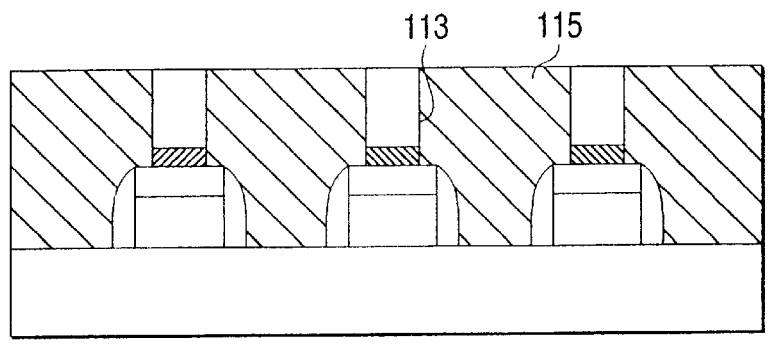
FIG. 32 is a sectional view of a step of manufacturing the conventional semiconductor device.
Figure 33:
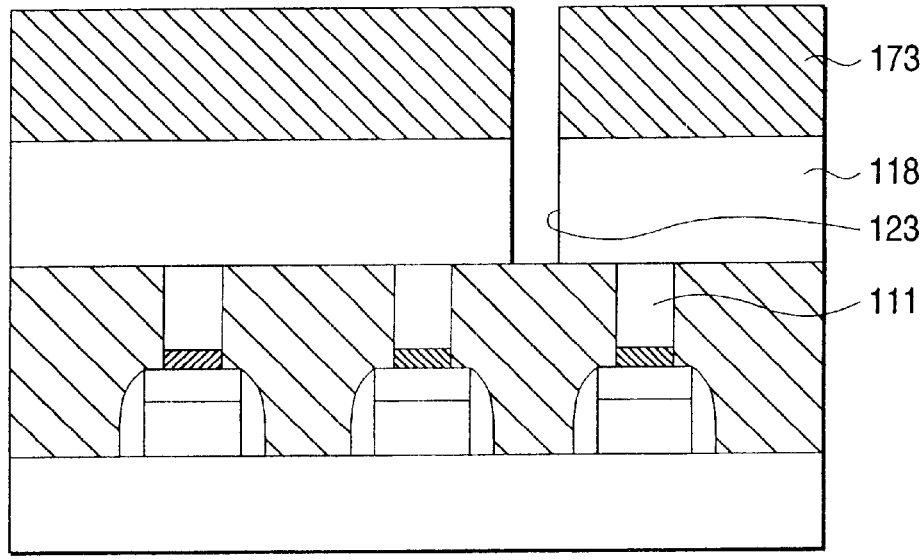
FIG. 33 is a sectional view of a step of manufacturing the conventional semiconductor device.
Figure 34:
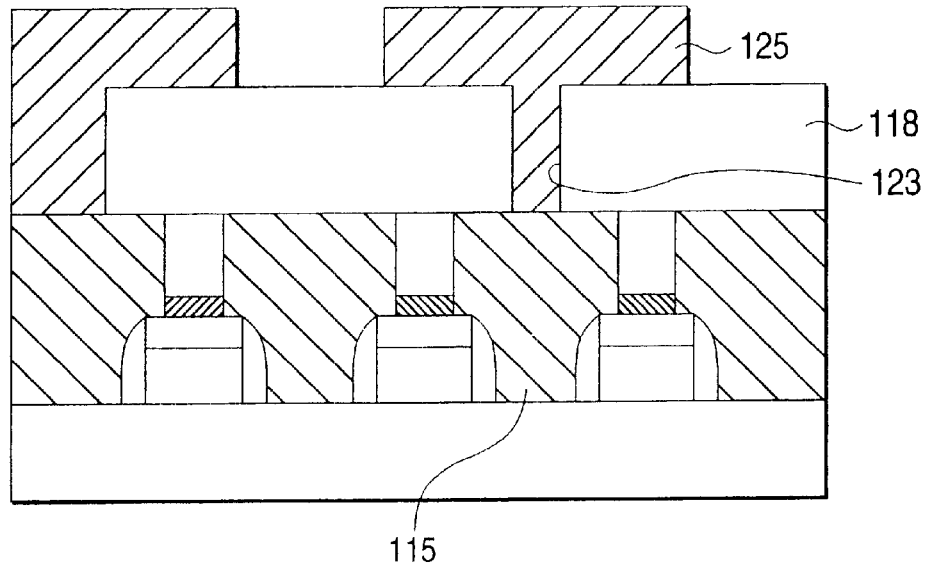
FIG. 34 is a sectional view of a step of manufacturing the conventional semiconductor device.
Figure 35:
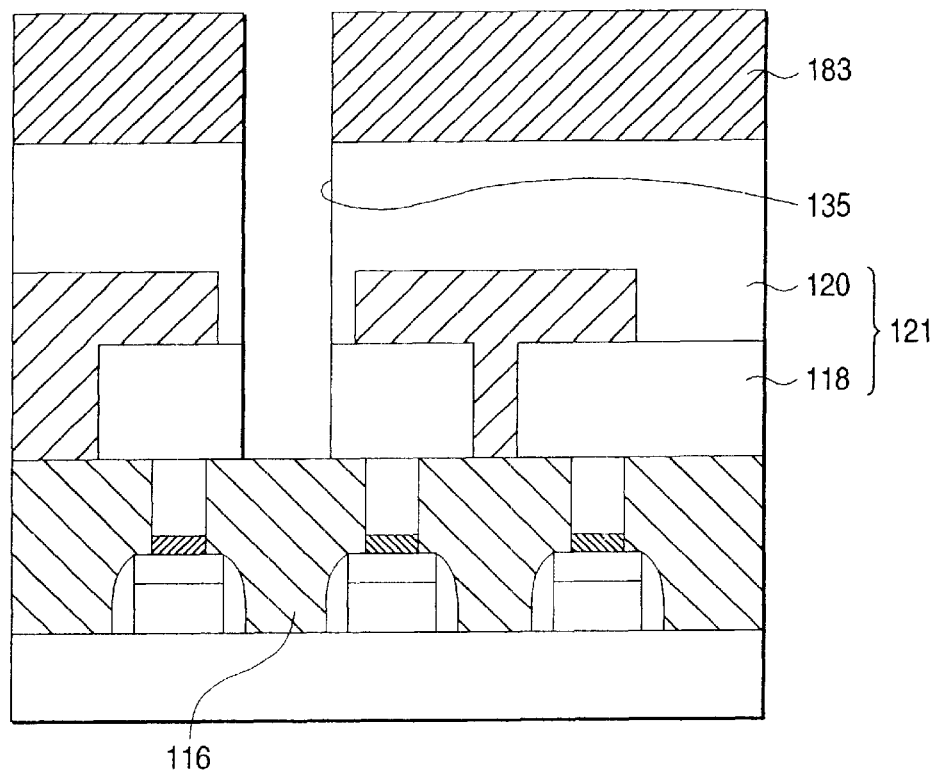
FIG. 35 is a sectional view of a step of manufacturing the conventional semiconductor device.
Figure 36:
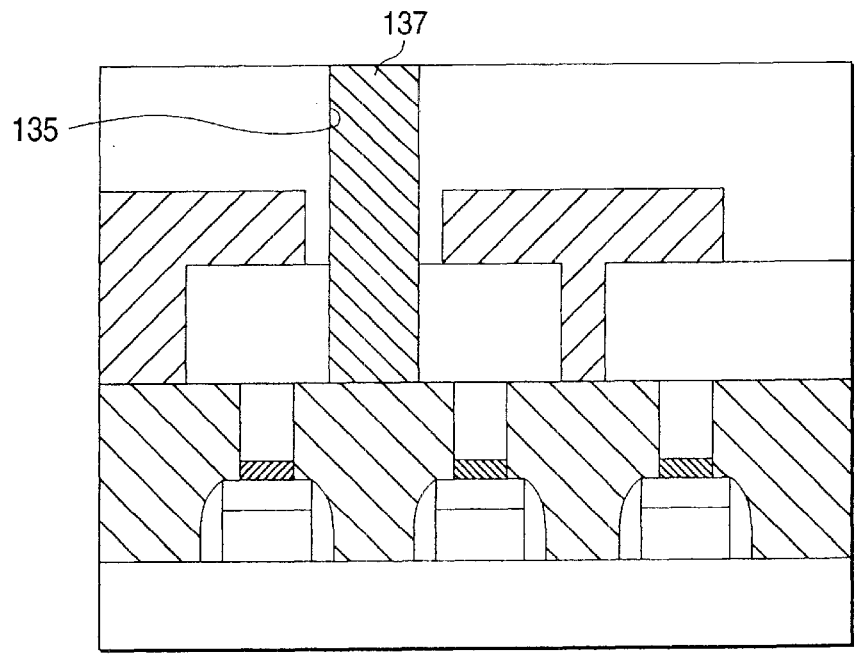
FIG. 36 is a sectional view of a step of manufacturing the conventional semiconductor device.
Figure 37:
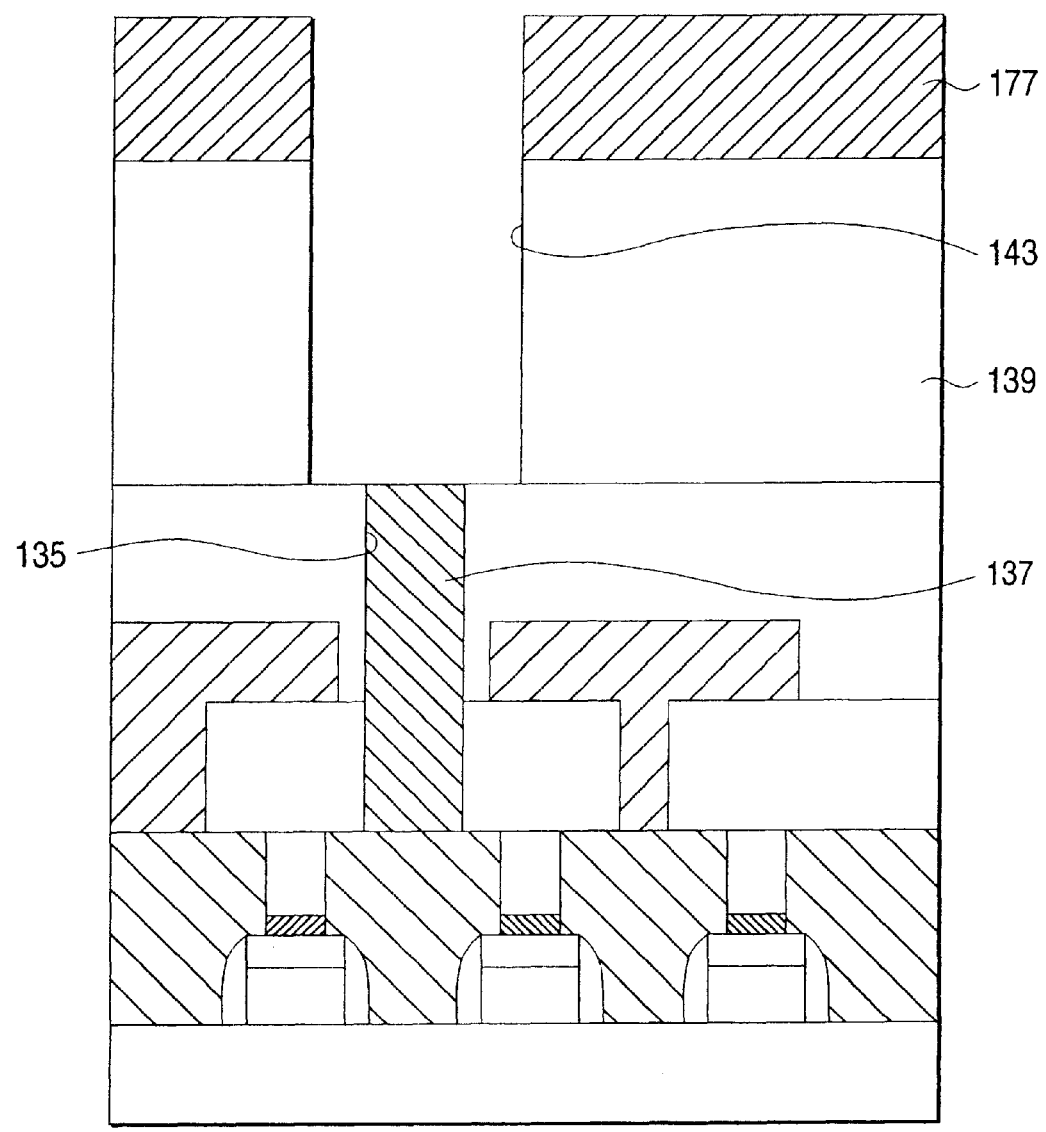
FIG. 37 is a sectional view of a step of manufacturing the conventional semiconductor device.
Figure 38:
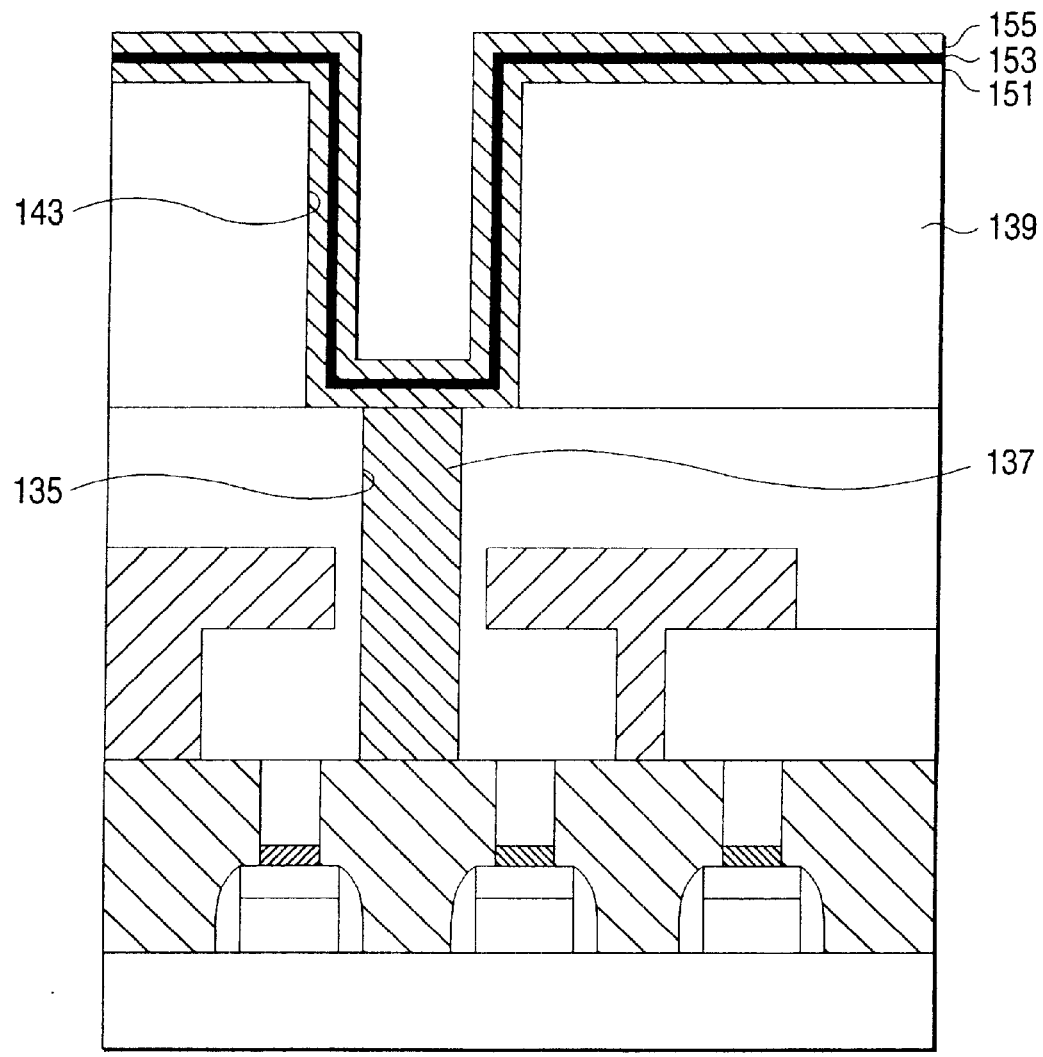
FIG. 38 is a sectional view of a step of manufacturing the conventional semiconductor device.

Referring to FIG. 28, a polysilicon film 51, oxide/nitride film 53 and polysilicon film 55 are successively formed to extend on the surface of the conductive layer 16, along the inner walls of the openings 13, 35 and 43 and on the insulating layer 39.

Finally, referring to FIG. 22 again, the polysilicon film 51, the oxide/nitride film 53 and the polysilicon film 55 which are located on the insulating film 39 are removed by the CMP or etch-back technique to form a capacitor 59 comprising the capacitor lower electrode 52, capacitor dielectric film 54 and a capacitor upper electrode 56.

Thus, the semiconductor device according to the third embodiment is completed.

In accordance with the third embodiment, since the semiconductor device is manufactured by the normal process without using the etching stopper film, the number of steps can be reduced and the throughput can be improved.

Incidentally, the openings can have any shape not limited to that proposed in the above embodiments as long as the openings have different diameters at their coupling portions.

In the above embodiments, although the capacitor lower electrode is not subjected to any processing, it may be subjected to the processing for forming unevenness on a surface of the capacitor lower electrode. In this case, the surface area can be increased to obtain a large capacitance.

The present invention, which is constructed as described above, can provide the following effects.

In accordance with the first aspect of the invention, since the openings formed in each of the insulating layers has different diameter at least at each coupling portions, the surface area of the openings can be increased, thereby providing a semiconductor device having a large capacitance.

In accordance with the second aspect of the invention, since the openings formed in the insulating layers including wiring have different diameters from each other at their coupling portion. Therefore, the surface area of the openings can be increased, thereby providing a semiconductor device having a large capacitance.

In accordance with the third aspect of the invention, a semiconductor capable of providing stable electric connection between the capacitor lower electrode and the semiconductor substrate can be obtained.

In accordance with the fourth aspect of the invention, since the surface area of the first opening is increased, a semiconductor device having a further increased capacitance can be obtained.

In accordance with the fifth aspect of the invention, since the surface area of the second opening is increased, a semiconductor device having a further increased capacitance can be obtained.

In accordance with the sixth aspect of the invention, a method of manufacturing a semiconductor device can be obtained which has a further increased capacitance and great reliability with no poor contact due to a modified layer created between conductive layers since the conductive layers once formed are removed to form openings.

In accordance with the seventh aspect of the invention, a method of manufacturing a semiconductor device with a further increased capacitance can be obtained.

In accordance with the eighth aspect of the invention, since the capacitor lower electrode is connected to the semiconductor substrate through the conductive layer, a semiconductor device being electrically stable can be obtained.

In accordance with the ninth aspect of the invention, since the surface area of the opening is further increased, a semiconductor device having a larger capacitor capacitance can be obtained.

In accordance with the tenth aspect of the invention, since the surface area of the opening is further increased, a semiconductor device having a larger capacitor capacitance can be obtained.

What is claimed is:

1. A semiconductor device having a capacitor, comprising:

a semiconductor substrate;

first, second and third insulating layers formed on the semiconductor substrate;

an opening formed in each of the first, second and third insulating layers so as to communicate with one another at a coupling portion, each opening having a different diameter at least at each of the coupling portions;

a conductive layer formed partially or substantially entirely in the opening of the first insulating layer being in contact with the semiconductor substrate, the conductive layer electrically connected to the semiconductor substrate;

a capacitor lower electrode formed to extend along the surfaces of the opening formed in each of the insulating layers and on the conductive layer; and a capacitor upper electrode formed on the capacitor lower electrode through a capacitor insulating film.

2. A semiconductor device having a capacitor, comprising:

a semiconductor substrate;

a first insulating layer formed on the semiconductor substrate, the first insulating layer including a first wiring and defining a first opening which reaches the semiconductor substrate;

a second insulating layer formed on the first insulating layer, the second insulating layer including a second wiring and defining a second opening which communicates with the first opening at a first coupling portion;

a third insulating layer formed on the second insulating layer, and the third insulating layer defining a third opening which communicates with the second opening at a second coupling portion;

a capacitor lower electrode formed on the surfaces of the first, second, and third openings; and a capacitor upper electrode formed on the capacitor lower electrode through a capacitor dielectric film, wherein each of the openings have different diameters at least at the first coupling portion and the second coupling portion, respectively.

3. The semiconductor device according to claim 2, wherein the capacitor lower electrode is electrically connected to the semiconductor substrate through a conductive layer formed partially or substantially entirely in the first opening.

4. The semiconductor device according to claim 2, wherein the first opening is defined by the first insulating layer and an etching stopper film formed on a surface of the first wiring.

5. The semiconductor device according to claim 2, wherein the second opening is defined by the second insulating layer and an etching stopper film formed on a surface of the second wiring.

6. A method of manufacturing a semiconductor device having a capacitor, comprising the steps of:

forming, on a semiconductor substrate, a first insulating layer which includes a first wiring and has a first opening reaching the semiconductor substrate;

forming, in the first opening, a first conductive layer electrically connected to the semiconductor substrate;

forming, on the first insulting layer, a second insulating layer including a second wiring;

forming, in the second insulating layer, a second opening which communicates with the first opening at a first coupling portion and has a diameter different from that of the first opening at least at the first coupling portion;

forming, in the second opening, a second conductive layer electrically connected to the first conductive layer;

forming a third insulating layer on the second insulating layer;

forming, in the third insulating layer, a third opening which communicates with the second opening at a second coupling portion and has a diameter different from that of the second opening at least at the second coupling portion;

removing at least the second conductive layer through the third opening;

forming, on the surfaces of the first, second, and third openings, a capacitor lower electrode electrically connected to the semiconductor substrate; and forming, on the capacitor lower electrode, a capacitor upper electrode through a capacitor dielectric film.

7. The method according to claim 6, wherein, in the step of forming the second conductive layer, the second conductive layer is formed to extend onto the second insulating layer.

8. The method according to claim 7, wherein, in the step of removing the second conductive layer, a part of the first conductive layer is removed; and in the step of forming the capacitor lower electrode, the capacitor lower electrode is formed to be electrically connected to the semiconductor substrate through the first conductive layer.

9. The method according to claim 7, wherein the first opening is formed in a self-aligned manner using an etching stopper film formed on the first wiring.

10. The method according to claim 9, wherein the second opening is formed in a self-aligned manner using an etching stopper film formed on the second wiring.

11. The method according to claim 6, wherein, in the step of removing the second conductive layer, a part of the first conductive layer is removed; and in the step of forming the capacitor lower electrode, the capacitor lower electrode is formed to be electrically connected to the semiconductor substrate through the first conductive layer.

12. The method according to claim 6, wherein the first opening is formed in a self-aligned manner using an etching stopper film formed on the first wiring.

13. The method according to claim 12, wherein the second opening is formed in a self-aligned manner using an etching stopper film formed on the second wiring.

* * * * *